(12) United States Patent
Kong et al.

(10) Patent No.: US 10,762,853 B2
(45) Date of Patent: Sep. 1, 2020

(54) GATE DRIVING CIRCUIT AND ELECTROLUMINESCENT DISPLAY USING THE SAME

(71) Applicant: LG Display Co., Ltd., Seoul (KR)

(72) Inventors: Chungsik Kong, Paju-si (KR); Honggyu Han, Paju-si (KR); Mihee Shin, Paju-si (KR); Sewan Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/050,129

(22) Filed: Jul. 31, 2018

(65) Prior Publication Data
US 2019/0066604 A1 Feb. 28, 2019

(30) Foreign Application Priority Data

Aug. 31, 2017 (KR) .................. 10-2017-0111475
Sep. 18, 2017 (KR) .................. 10-2017-0119848
Nov. 20, 2017 (KR) .................. 10-2017-0155014

(51) Int. Cl.
| | | |
|---|---|---|
| G11C 19/00 | (2006.01) | |
| G09G 3/3291 | (2016.01) | |
| G11C 19/28 | (2006.01) | |
| G09G 3/3266 | (2016.01) | |
| G09G 3/36 | (2006.01) | |

(52) U.S. Cl.
CPC ......... *G09G 3/3291* (2013.01); *G09G 3/3266* (2013.01); *G11C 19/28* (2013.01);
(Continued)

(58) Field of Classification Search
None
See application file for complete search history.

(56) References Cited

U.S. PATENT DOCUMENTS

| 8,339,424 | B2 * | 12/2012 | Jeong | .................. G09G 3/3266 |
| | | | | 345/211 |
| 2008/0211744 | A1 * | 9/2008 | Lee | ....................... G09G 3/3208 |
| | | | | 345/76 |

(Continued)

FOREIGN PATENT DOCUMENTS

| KR | 10-2012-0024214 A | 3/2012 |
| KR | 10-2012-0077792 A | 7/2012 |

(Continued)

*Primary Examiner* — Tuan T Lam
(74) *Attorney, Agent, or Firm* — Morgan, Lewis & Bockius LLP

(57) ABSTRACT

An organic light emitting display comprises pixels connected to gate lines, and a gate driving circuit to supply a gate signal to at least one gate line, and having stages connected to each other in a cascading way. A $n^{th}$ (n is a positive integer) stage of the gate driving circuit includes a Q1 node charging unit to charge a Q1 node to a turn-on voltage using first and second clock signals in reverse-phase, and a pull-up transistor to apply the turn-on voltage to an output terminal in response to a Q1 node voltage. The Q1 node charging unit includes a first charging unit to charge the Q1 node voltage to the turn-on voltage using the second clock signal; and a second charging unit to charge a Q2 node, coupled to the Q1 node, using the first clock signal in a section where the Q1 node has the turn-on voltage.

7 Claims, 25 Drawing Sheets

(52) U.S. Cl.
CPC ......... *G11C 19/287* (2013.01); *G09G 3/3677* (2013.01); *G09G 2300/0408* (2013.01); *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 2010/0013824 A1* | 1/2010 | Kim | G09G 3/3266 |
| | | | 345/214 |
| 2012/0188290 A1 | 7/2012 | Park et al. | |
| 2012/0212517 A1* | 8/2012 | Ahn | G11C 19/28 |
| | | | 345/690 |
| 2013/0342584 A1* | 12/2013 | Song | G09G 3/30 |
| | | | 345/690 |
| 2016/0321999 A1* | 11/2016 | Yang | G09G 3/3266 |
| 2017/0116920 A1* | 4/2017 | Kwon | G09G 3/3266 |
| 2017/0287395 A1* | 10/2017 | Jang | G09G 3/3233 |
| 2017/0301295 A1* | 10/2017 | Park | G09G 3/3258 |
| 2017/0345366 A1* | 11/2017 | Jang | G09G 3/3674 |
| 2018/0144688 A1* | 5/2018 | Lee | G09G 3/3225 |
| 2018/0211590 A1* | 7/2018 | Zhang | G09G 3/3208 |
| 2019/0130847 A1* | 5/2019 | Um | G09G 3/3291 |
| 2019/0172397 A1* | 6/2019 | Lee | G09G 3/3266 |

FOREIGN PATENT DOCUMENTS

| | | |
|---|---|---|
| KR | 10-2012-0084967 A | 7/2012 |
| KR | 10-2016-0135456 A | 11/2016 |
| KR | 10-2017-0079775 A | 7/2017 |

\* cited by examiner

GATE DRIVING CIRCUIT AND ELECTROLUMINESCENT DISPLAY USING THE SAME

This application claims the benefit of Korean Patent Application No. 10-2017-0111475 filed on Aug. 31, 2017 and Korean Patent Application No. 10-2017-0155014 filed on Nov. 20, 2017 and Korea Patent Application No. 10-2017-0119848 filed on Sep. 18, 2017, all of which are incorporated herein by reference for all purposes as if fully set forth herein.

BACKGROUND

Technical Field

The present disclosure relates to a gate driving circuit with an enhanced driving capability, and an electroluminescent display using the same.

Discussion of the Related Art

Due to its compact and light, Flat Panel Display (FPD) has been widely used not just in a monitor of a desktop computer, but also in a monitor of a mobile computer, such as a laptop computer and a tablet PC, and a mobile phone. These days, not just flat displays, but also various types of displays including curved display, flexible display, rollable display, and wearable display are being developed. These displays are, for example, Liquid Crystal Display (LCD), Plasma Display Panel (PDP), Field Emission Display (FED), electroluminescent display, Organic Light Emitting diode Display (OLED), Quantum Dot Display (QD), etc.

Among them, the electroluminescent display has a fast response speed and a wide viewing angle, and is able to produce brightness with high luminous efficiency. Generally, the electroluminescent display uses a transistor, which is turned on by a scan signal, to apply a data voltage to a gate electrode of a driving transistor, and charges the data voltage, supplied to the driving transistor, in a storage capacitor. In addition, using an emission signal so as to enable electroluminescent devices to emit light. The electroluminescent devices may include organic electroluminescent devices and inorganic electroluminescent devices, and thus, the electroluminescent display may be classified as an organic light emitting display or an inorganic light emitting display.

The electroluminescent display is driven using an emission signal and one or more scan signals. In general, a gate driving circuit generating an emission signal and scan signals, which are gate signals, includes a shift register to output the gate signals sequentially. The gate driving circuit may be implemented in the form of a Gate In Panel (GIP) composed of a set of Thin Film Transistors (TFTs) in a bezel area, which is a non-display area, of a display panel. A gate driving circuit in the form of GIP includes stages, of which the number corresponds to the number of gate lines, wherein each of the stages outputs a gate pulse to be supplied to a corresponding gate line from among the respective gate lines.

The shift register may be implemented in various forms, and efforts are being made to optimize circuit configuration of the gate driving circuit in order to enhance driving capability and reliability.

As mentioned above, the gate driving circuit may be implemented in the form of GIP which is a technique by which the gate driving circuit is embedded in a display panel together with a pixel array. Such a gate driving circuit may be called a GIP circuit. The GIP circuit may include a shift register, and stages of the shift register may generate outputs in response to a start pulse and shift the generated outputs in accordance with a clock signal. The gate driving circuit may include stages including a plurality of transistors, and the stages may be connected to each other in a cascading way and generate outputs sequentially. In this case, the transistors may include TFTs as a kind of transistor.

The stages may each include a Q node for controlling a pull-up transistor, and a QB (Q bar) node for controlling a pull-down transistor. For example, each of the stages may include transistors each of which charges and discharges the Q node and the QB node to opposite voltages in response to a start voltage signal and a clock signal input from a previous stages.

The QB node is charged and discharged to a voltage opposite to that of the Q node. When the Q node has a high potential voltage, the QB node has a low potential voltage. When the Q node has a low potential voltage, the QB node has a high potential voltage. The pull-up transistor or the pull-down transistor is turned on in response to a low potential voltage applied to the Q node or the QB node, and the pull-up transistor or the pull-down transistor is turned off in response to a high potential voltage being applied to the Q node or the QB node, and thus a transistor connected to a gate line is turned on/off. Each of the pull-up transistor and the pull-down transistor has one electrode connected to an output terminal, and the output terminal is connected to a gate line for providing a gate signal to a pixel array.

As mentioned above, an output signal is applied by the Q node and the QB node to the output terminal. Thus, if the Q node or the QB node become floating, a voltage of the Q node or the QB node may be variable, rather than being fixed, and therefore, a wrong output signal may be output.

An electroluminescent display is driven using an emission signal and one or more scan signals. To drive the electroluminescent display, not just a signal for scanning a data signal, but also an emission signal for stopping a light emitting device from emitting light during scanning of a scan signal is needed. In this case, the emission signal and the scan signal may be in combination referred to as a gate signal.

Generally, a scan signal may be inverted to generate an emission signal. However, the emission generated by inverting the scan signal may experience interference at a time of pulse width modulation driving of the electroluminescent display and scanning of a scan signal. In addition, an increase in load of a clock signal and an emission signal due to high resolution of a display panel may reduce operating margin, thereby possibly causing an error in an emission driver.

Thus, in order to solve the aforementioned problems, the inventors of this specification have come up with a gate driving circuit with enhanced driving capability and reliability, and an electroluminescent display using the same.

An object of the present disclosure is to provide a gate driving circuit, which has improved driving capability and reliability since a high potential voltage or a low potential voltage is applied without causing a Q node to float so that a wrong output is prevented from being output from an output terminal, and an electroluminescent display using the gate driving circuit.

Another object of the present disclosure is to provide a gate driving circuit capable of improving driving capability of transistors, maintaining stable outputting characteristics, and implementing a narrow bezel, and an electroluminescent display including the gate driving circuit.

Yet another object of the present disclosure is to provide a gate driving circuit, which avoids interference during pulse width modulation driving of an electroluminescent display and during scanning of a scan signal to thereby improve accuracy of an emission signal, and the electroluminescent display using the gate driving circuit.

Yet another object of the present disclosure is to provide a gate driving circuit capable of operating without an error nonetheless of increase in load of a clock signal and an emission signal due to high resolution of an electroluminescent display, and the electroluminescent display using the gate driving circuit.

Objects of the present disclosure should not be limited to the aforementioned objects and other unmentioned objects will be clearly understood by those skilled in the art from the following description.

SUMMARY

Accordingly, embodiments of the present disclosure are directed to a gate driving circuit and an electroluminescent display using the same that substantially obviate one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescent display comprises pixels connected to gate lines, and a gate driving circuit configured to supply a gate signal to at least one of the gate lines, and composed of a plurality of stages connected to each other in a cascading way. A $n^{th}$ (n is a positive integer) stage of the gate driving circuit may include a Q1 node charging unit configured to charge a Q1 node to a turn-on voltage using first and second clock signals in reverse-phase, and a pull-up transistor configured to apply the turn-on voltage to an output terminal in response to a Q1 node voltage. The Q1 node charging unit may include a first charging unit configured to charge the Q1 node voltage to the turn-on voltage using the second clock signal, and a second charging unit configured to charge a Q2 node, coupled to the Q1 node, using the first clock signal in a section where the Q1 node has the turn-on voltage.

In another aspect of a gate driving circuit comprises a plurality of stages connected to each other in a cascading way and configured to output a gate signal. Each of the plurality of stages outputs the gate signal using first and second clock signals. A $n^{th}$ (n is a positive integer) stage from among the plurality of stages comprises a pull-up transistor configured to apply a turn-on voltage to an output terminal in response to a voltage of a Q1 node, a first capacitor connected between the Q1 node and a Q2 node, a first transistor comprising a gate electrode connected to an input terminal of the second clock signal, a source electrode connected to an input terminal of the start signal, and a drain electrode connected to the Q1 node, and a second transistor comprising a gate electrode connected to the Q1 node, a source electrode connected to an input terminal of the first clock signal, and a drain electrode connected to the Q2 node.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this specification, illustrate embodiments of the disclosure and together with the description serve to explain the principles. In the drawings.

DETAILED DESCRIPTION

Figure 1:
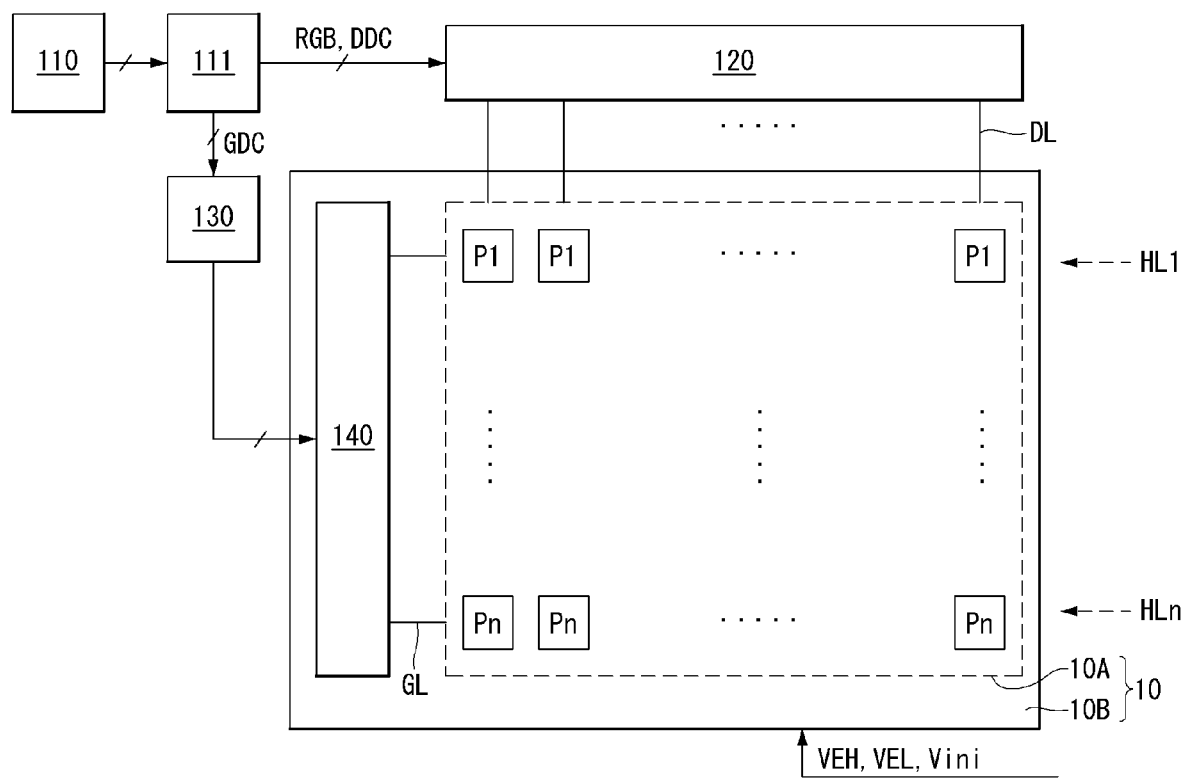
FIG. 1 is a diagram illustrating configuration of an electroluminescent display according to this specification.

Advantages and features of the present disclosure and methods for achieving the advantages and features may become apparent from the embodiments to be hereinafter described in conjunction with the drawings. However, the present disclosure is not limited to the embodiments and may be embodied in various modifications. The embodiments are provided merely to fully disclose the present disclosure and advise those skilled in the art of the category of the disclosure. The present disclosure is defined only by the appending claims. The same reference numbers denote the same elements throughout the specification.

The shapes, sizes, ratios, angles, numbers and the like disclosed in the drawings are exemplary and the embodiment is not limited thereto. Like reference numerals refer to like elements throughout the specification. In the following description of the embodiment, a detailed description of known related arts will be omitted when it is determined that the gist of the embodiment may be unnecessarily obscured. In the case where the terms "includes," "having," "done," etc. are used in this specification, other parts may be added unless "only" is used. As used herein, the singular forms "a," "an," and "the" are intended to include the plural forms as well, unless the context clearly indicates otherwise.

In interpreting the constituent elements, it is construed to include the error range even if there is no separate description.

In the case of a description of the positional relationship, for example, if the positional relationship between two parts is described as "on," "above," "under," or "next to" is not used, one or more other portions may be located between the two portions unless "immediately" or "directly" is used.

In the case of a description of a temporal relationship, for example, if a temporal posterior relationship is described by "after," "subsequent to," "next," "before," etc., a non-continuous case is also included unless "immediately" or "directly" is used.

The first, second, and the like are used to describe various components, but these components are not limited by these terms. These terms are only used to distinguish one component from another. Therefore, the first component mentioned below may be the second component within the technical spirit of the embodiment.

It is to be understood that the features of various embodiments may be partially or entirely coupled or combined with each other and technically various interlocking and driving are possible, and that the embodiments may be practiced independently of each other.

Switch elements in a gate driving circuit of this specification may be implemented as n-type or p-type transistors in a Metal Oxide Semiconductor Field Effect Transistor (MOSFET) structure. In the following embodiments, the switch elements are exemplified by a p-type transistor, but aspects of the present disclosure are not limited thereto. A transistor is a three-electrode element including a gate, a source, and a drain. The source is an electrode for supplying a carrier to the transistor. The carrier flows from the source in the transistor. The drain is an electrode through which the carrier flows out of the transistor. That is, the flow of the carrier in a MOSFET is from the source to the drain. In the case of a n-type MOSFET (NMOS), since a carrier is an electron, a source voltage is lower than a drain voltage so that the carrier flows from the source to the drain. In the case of the n-type MOSFET, since the electron flows from the source to the drain, the flow direction of the current is from the drain to the source. In the case of the p-type MOSFET (PMOS), since the carrier is a hole, a source voltage is higher than a drain voltage so that the hole flows from the source to the drain. Since the hole flows from the source to the drain in the p-type MOSFET, the current flows from the source to the drain. The source and the drain of the MOSFET are not fixed. For example, the source and the drain of the MOSFET may be changed depending on an applied voltage. In the following embodiments, the present disclosure is not limited by a source and a drain of a transistor.

Figure 2:
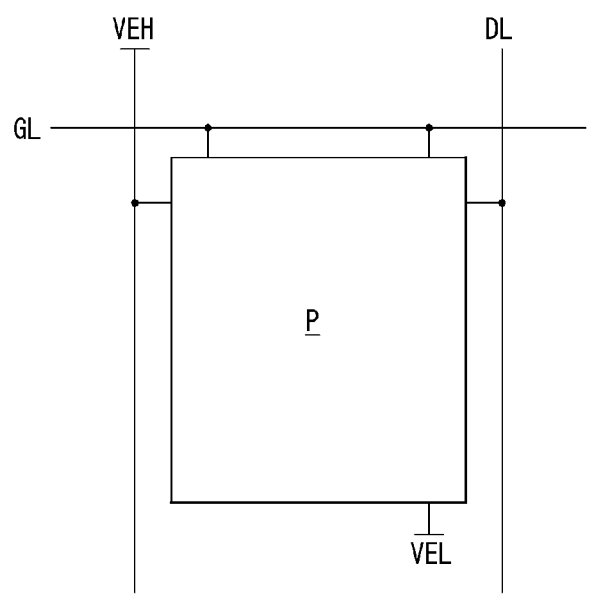
FIG. 2 is a block diagram illustrating a pixel shown in FIG. 1.
Figure 3:
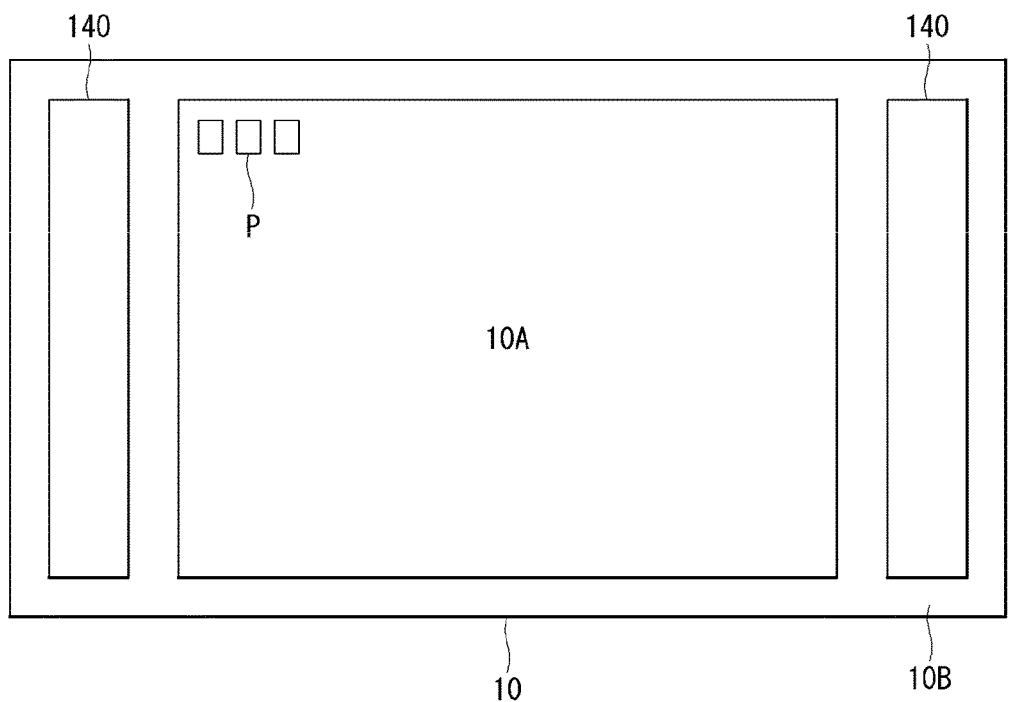
FIG. 3 is a diagram illustrating exemplary arrangement of a gate driving circuit shown in FIG. 1.

FIG. 1 is a diagram illustrating configuration of a display according to this specification. FIG. 2 is a block diagram illustrating a pixel shown in FIG. 1. FIG. 3 is a diagram illustrating exemplary arrangement of a gate driving circuit shown in FIG. 1.

With reference to FIG. 1, an electroluminescent display according to the present disclosure includes a display panel 10 in which pixels P are arranged in a matrix form, a data driver 120, a gate driving circuit 130 and 140, an image processing unit 110, and a timing controller 111. In this case the form in which the pixels P are arranged is not limited to the matrix form, and may be any of various forms, such as a stripe form and a diamond form.

The display panel includes a display region 10A in which pixels P are arranged and which displays an image, and a non-display region 10B in which the gate driving circuit 130 and 140 are arranged and which does not display an image.

The display region 10A includes a plurality of pixels P, and displays an image based on grayscales of the respective pixels P. The pixels P are arranged along first to $n^{th}$ pixel lines HL1 to HLn. Each pixel P is connected to a data line DL aligned along a column line, and a gate line GL aligned along a pixel line HL. Pixels aligned on the same pixel line share the same gate line GL and thus they are driven at the same time. When pixels aligned on the first pixel line HL1 are defined as first pixels P1, and pixels aligned on the $n^{th}$ pixel line HLn are defined as the $n^{th}$ pixels Pn, the pixels are driven in order from the first pixels P1 to the $n^{th}$ pixels Pn. In addition, a sampling period for writing data into one gate line may be defined as one horizontal time 1H.

The image processing unit 110 outputs a driving signal for driving a variety of devices, in addition to image data supplied from the outside. The driving signal output from the image processing unit 110 may include a data enable signal, a vertical synchronization signal, a horizontal synchronization signal, and a dot clock signal.

The timing controller 111 is for controlling a driving timing of the data driver 120 and the gate driving circuit. To this end, the timing controller 111 may re-arrange digital video data RGB, which is input from the outside, to fit the resolution of the display panel 10, and supplies the re-arranged digital video data RGB to the data driver 120. In addition, the timing controller 111 generates a data control signal DDC for controlling an operation timing of the data driver 120 and a gate control signal GDC for controlling an operation timing of the gate driving circuit, based on timing signals such as a vertical synchronization signal, a horizontal synchronization signal, a dot clock signal, and a data enable signal.

The data driver 120 is for driving data lines DL. To this end, the data driver 120 converts digital video data RGB, which is input from the timing controller 111, into an analog data voltage based on a data control signal DDC and supplies the analog data voltage to the data lines DL. The data driver 120 may be formed as an Integrated Circuit (IC).

The gate driving circuit may include a level shifter 130 and a gate driving circuit 140. The level shifter 130 may be formed as an IC in a Printed Circuit Board (PCB) connected to the display panel 10, and the gate driving circuit 140 may be formed as a GIP circuit in the non-display region 10B. In this case, the method of implementing the level shifter 130 and the gate driving circuit 140 is not limited thereto.

The level shifter 130 shifts voltage levels of clock signals and a start signal VST under the control of the timing controller 111, and then supplies the clock signals and the start signal VST to the gate driving circuit 140. The gate driving circuit 140 is formed as a combination of multiple Thin Film Transistors (TFTs) (which are hereinafter referred to as transistors) in the non-display region 10B of the display panel 10 in a GIP method.

The gate driving circuit 140 may include a scan driver for outputting a scan signal, and an emission driver for outputting an emission signal. In this case, the emission signal may be called an emission control signal, the scan signal and the emission signal may be called a gate signal, and a component for outputting the gate signal may be called a gate driving circuit. The scan driver and an emission driver may include a plurality of stages connected to each other in a cascading way. As shown in FIG. 1, the gate driving circuit 140 may be disposed on one side of the display panel. In addition, with reference to FIG. 3, the gate driving circuit 140 may be formed as a GIP circuit in the non-display region 10B of the display panel 10, and may be disposed on the left and right sides of the display panel.

With reference to FIG. 2, a pixel P is connected to a gate line GL, a data line DL, a high potential voltage VEH, and a low potential voltage VEL. The number of transistors and capacitors and a driving method of the pixel may be determined depending on configuration of a pixel circuit.

A pixel may include an organic light emitting diode, a switching transistor, a driving transistor, an emission control transistor, a capacitor, etc. However, the pixel is not limited thereto. The switching transistor transfers a data voltage to the capacitor in response to a scan signal. The capacitor transfers the data voltage to a gate electrode of the driving transistor. In response to the data voltage transferred from the capacitor, the driving transistor generates a driving current that drives a light emitting device. The emission control transistor controls a light emitting time of the light emitting device in response to an emission signal.

Figure 4:
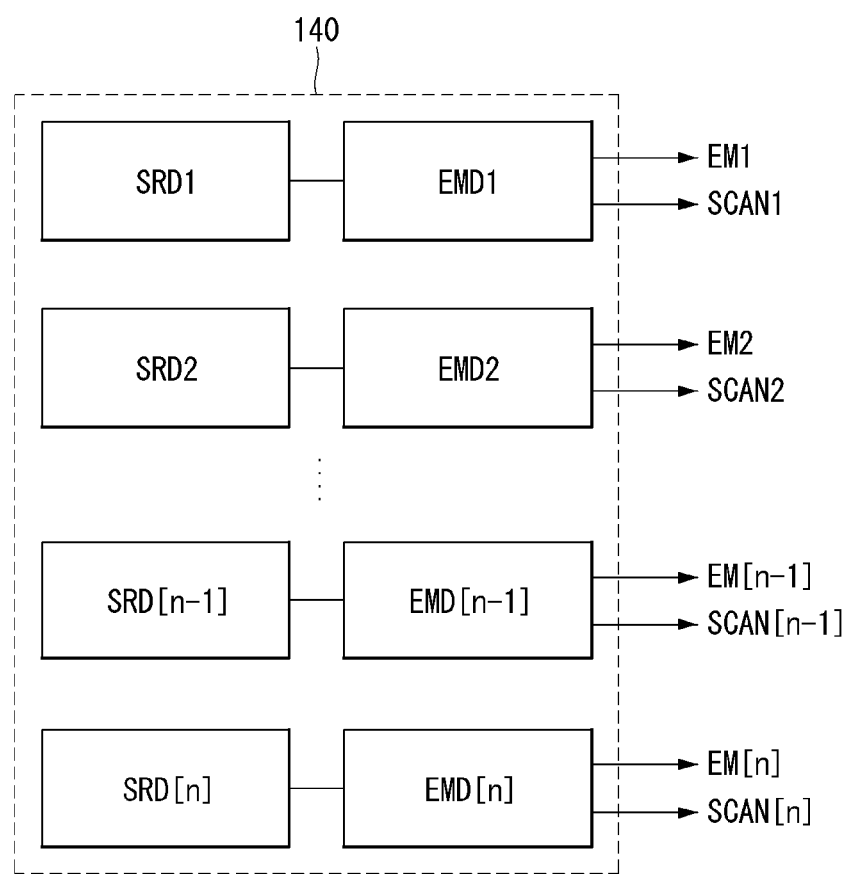
FIG. 4 is a block diagram illustrating a gate driving circuit disposed on one side of a display panel according to an embodiment of this specification.

A pixel P may be implemented in any of various structures, such as 3T1C, 3T2C, 4T1C, 4T2C, 5T1C, 5T2C, 6T1C, 6T2C, 7T1C, 7T2C, 8T1C, and 8T2C, depending on the number of transistors and capacitors additionally to compensate for degradation of transistor and a compensation method. In FIG. 2 shows only one gate line GL for convenience of explanation, and the I (I is an integer equal to or more than 2) number of gate lines may be provided depending on the number of transistors included in a pixel and a compensation method. FIG. 4 is a block diagram illustrating a gate driving circuit disposed on one side of a display panel according to an embodiment of this specification, and FIG. 5 is a block diagram illustrating emission drivers shown in FIG. 4.

As illustrated in FIG. 4, the gate driving circuit 140 includes scan drivers SRD1 to SRD[n] outputting scan signals SCAN1 to SCAN[n], and emission drivers EMD1 to EMD[n] outputting emission signals EM1 to EM[n]. The scan drivers SRD1 to SRD[n] are connected to first to $n^{th}$ scan lines. The emission drivers EMD1 to EMD[n] are connected to first to $n^{th}$ the emission lines.

The scan drivers SRD1 to SRD[n] and the emission drivers EMD1 to EMD[n] are configured as a plurality of stages for outputting signals in response to scan lines of a display panel. The first scan driver SRD1 and the first emission driver EMD1 may be defined as a first stage. The first stage SRD1 and EMD1 outputs a first scan signal SCAN1 and a first emission signal EM1 for driving a first pixel line HL1 of the display panel 10. A second scan driver SRD2 and a second emission driver EMD2 may be defined as a second stage. The second stage SRD2 and EMD2 outputs a second scan signal SCAN2 and a second emission signal EM2 for driving a second pixel line HL2 of the display panel 10.

Figure 5:
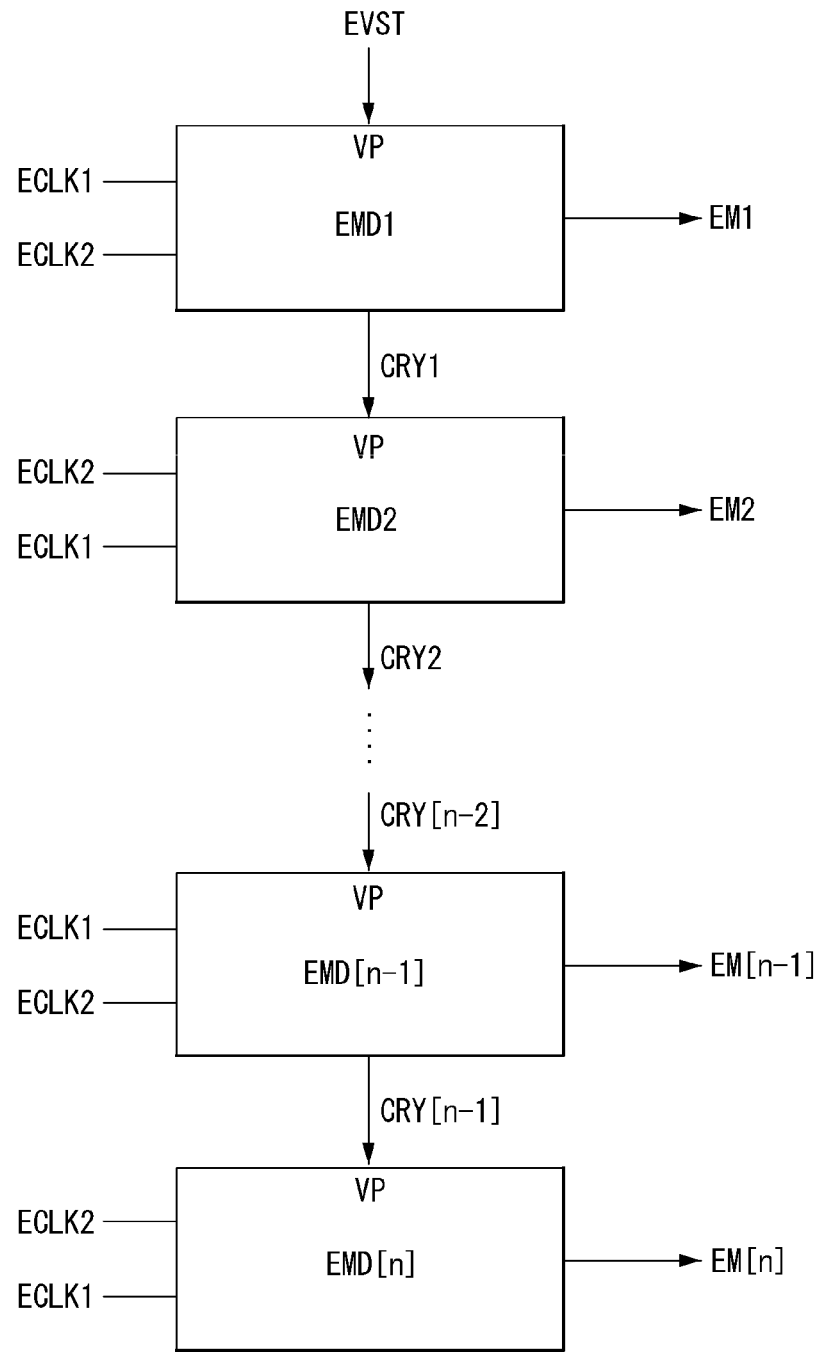
FIG. 5 is a block diagram illustrating emission drivers shown in FIG. 4.

As illustrated in FIG. 5, the first to $n^{th}$ emission drivers EMD1 to EMD[n] respectively generate the first to $n^{th}$ emission signals EM1 to EM[n] based on a first clock signal ECLK1, a second clock signal ECLK2, a start signal EVST, and the like.

The first clock signal ECLK1 and the second clock signal ECLK2 may swing between an emission high voltage and an emission low voltage, and may be in reverse-phase. In other words, the first emission clock signal ECLK1 and the second emission clock signal ECLK2 may be in reverse-phase and may have different emission clock cycles.

The low potential voltage VEL, which is the emission low voltage, may be between −8V and −7V, and the high potential voltage VEH, which is the emission high voltage, may be between 7V and 8V.

The first to $n^{th}$ emission drivers EMD1 to EMD[n] are in structure in which stages are connected to one another so that a signal at a previous stage is used at a next stage. The first emission driver EMD1 receives a start signal EVST through a start signal terminal VP. Then, the second to $n^{th}$ emission drivers EMD2 to EMD[n] respectively receive first to n-$1^{th}$ carry signals CRY1 to CRY[n-1] which are generated from emission drivers of their respective previous stages.

Thus, although the first emission driver EMD1 initiates an operation based on the start signal EVST received through the start signal terminal VP, the second emission driver EMD2 initiates an operation based on a first carry signal CRY1 output from the first emission driver EMD1. A signal generated from an emission driver at a previous stage or pre-previous stage may be used as a carry signal in consideration of an input/output timing of the carry signal, and thus, the carry signal may be defined as a signal generated by an emission driver at the $k^{th}$ (k is an integer equal to or greater than 1) stage.

Figure 6:
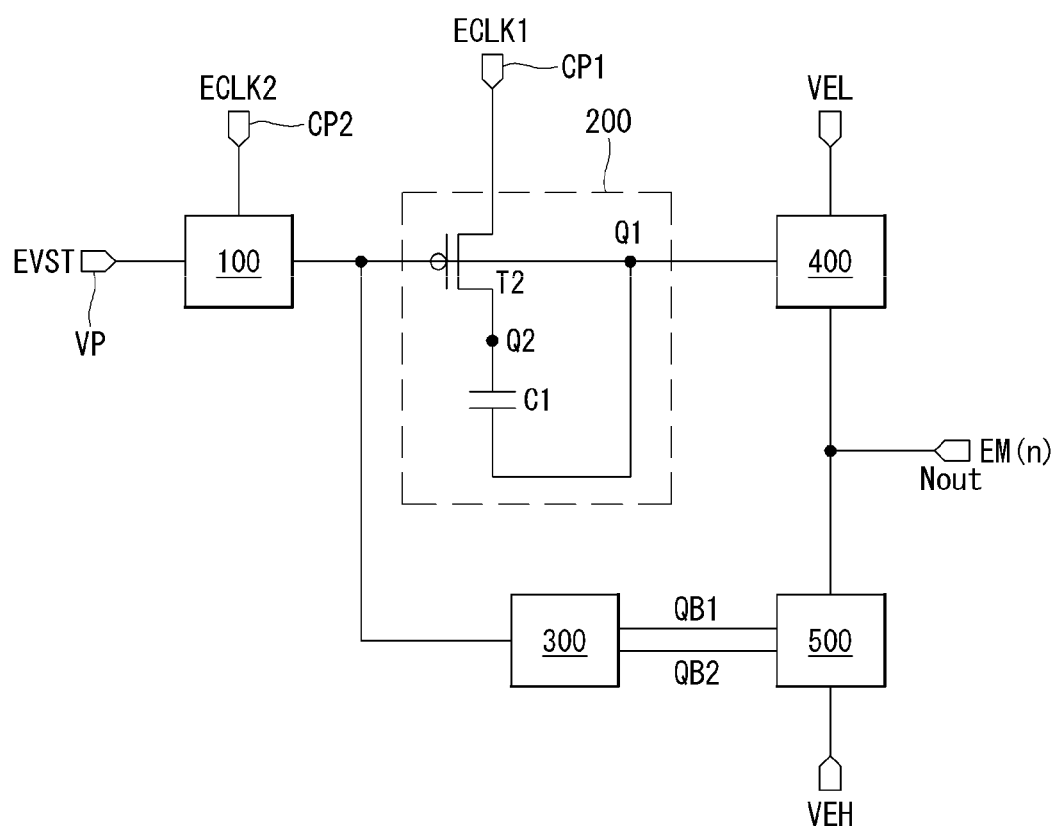
FIG. 6 is a diagram illustrating configuration of the $n^{th}$ emission driver in a gate driving circuit.

FIG. 6 is a diagram illustrating configuration of the $n^{th}$ emission driver in a gate driving circuit.

With reference to FIG. 6, the $n^{th}$ emission driver EMD(n) includes a Q1 node charging unit 100 and 200, a node controller 300, a pull-up unit 400, and a pull-down unit 500.

The Q1 node charging unit 100 and 200 may apply a turn-on voltage to the Q1 node Q1 using first and second clock signals ECLK1 and ECLK2 which are alternatively applied. The Q1 node charging unit 100 and 200 may include a first charging unit 100 which charges a turn-on voltage to the Q1 node Q1 using the second clock signal ECLK2, and a second charging unit 200 which applies a turn-on voltage to the Q1 node Q1 using the first clock signal ECLK1.

The node controller 300 controls voltages of the Q1 node Q1, a QB1 node QB1, and a QB2 node QB2.

The pull-up unit 400 outputs an emission signal in response to a voltage of the Q1 node Q1.

The pull-down unit 500 controls an output terminal Nout to output a turn-off voltage in response to at least one of a voltage of the QB1 node (QB1) or a voltage of the QB2 node (QB2).

Hereinafter, a detailed embodiment of an emission driver shown in FIG. 6 will be described.

Figure 7:
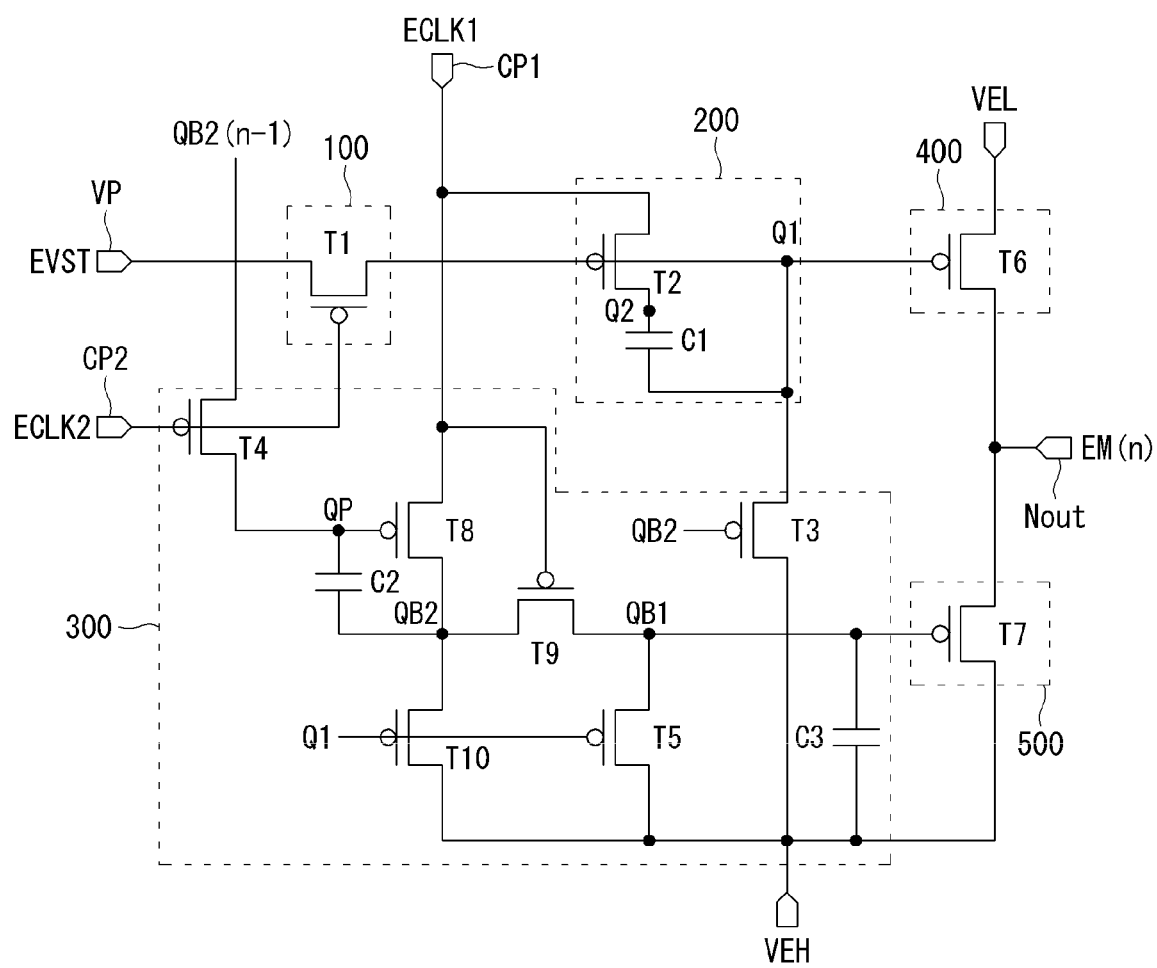
FIG. 7 is a diagram illustrating detailed configuration of a $n^{th}$ emission driver according to a first embodiment of this specification.

FIG. 7 is a diagram illustrating an $n^{th}$ emission driver according to a first embodiment of this specification.

With reference to FIG. 7, an $n^{th}$ emission driver EMD(n) includes a Q1 node charging unit 100 and 200, a node controller 300, a pull-up unit 400, and a pull-down unit 500.

The Q1 node charging unit 100 and 200 includes a first charger 100 and a second charger 200. The first charger 100 (hereinafter, referred to as a first transistor T1) includes a gate electrode connected to a second clock signal input terminal, a source electrode connected to a start signal input terminal VP providing a start signal EVST, and a drain electrode connected to a Q1 node Q1. The second clock signal input terminal CP2 receives a second clock signal ECLK2, and the start signal input terminal VP receives a start signal EVST or a carry signal. The carry signal may be an output signal from an $n-1^{th}$ emission driver EM(n-1). In a section where both the start signal EVST and the second clock signal ECLK2 are all at a turn-on voltage, the first transistor T1 charges the Q1 node Q1 to a low potential voltage VEL which is a turn-on voltage.

The second charging unit 200 includes a second transistor T2 and a first capacitor C1. The second transistor T2 includes a gate electrode connected to the Q1 node Q1, a source electrode connected to a first clock signal input terminal CP1, and a drain electrode connected to a Q2 node Q2. In a section where the Q1 node Q1 and the first clock signal ECLK1 are at a turn-on voltage, the second transistor T2 charges the Q2 node Q2 to a low potential voltage VEL which is a turn-on voltage.

The first capacitor C1 is connected between the Q1 node Q1 and the Q2 node Q2. The first capacitor C1 bootstraps a voltage of the Q2 node in response to a voltage of the Q1 node Q1. Alternatively, the first capacitor C1 bootstraps a voltage of the Q1 node Q1 in response to a voltage of the Q2 node Q2.

The node controller 300 includes a Q1 holding unit (hereinafter, referred to as a third transistor) T3, a QP node controller (hereinafter, referred to as a fourth transistor) T4, a QB2 node controller (hereinafter, referred to as an eighth transistor) T8, a QB1 node controller (hereinafter, referred to as a ninth transistor) T9, a QB1 holding unit (hereinafter, referred to as a fifth transistor) T5, a QB2 holding unit (hereinafter, referred to as a tenth transistor) T10, and second and third capacitors C2 and C3. The node controller 300 may be referred to as the Q1 node controller.

The third transistor T3 includes a gate electrode connected to the QB node (QB2), a source electrode connected to the Q1 node Q1, and a drain electrode connected to an input terminal of a high potential voltage VEH. When the QB2 node QB2 has a turn-on voltage, the Q1 node controller 300 charges the Q1 node Q1 to a high potential voltage VEH which is a turn-off voltage.

A QB node charging unit T4, T8, and T9 includes the fourth transistor T4, the eighth transistor T8, and the ninth transistor T9.

The fourth transistor T4 includes a gate electrode connected to the second clock signal input terminal CP2, a source electrode connected to a $n-1^{th}$ QB2 node QB2(n-1), and a drain electrode connected to the QP node QP. In a section where both the $n-1^{th}$ QB2 node QB2(n-1) and the second clock signal ECLK2 have a turn-on voltage, the fourth transistor T4 charges the QP node QP to a low potential voltage VEL which is a turn-on voltage. The $n-1^{th}$ QB2 node QB2(n-1) indicates a QB2 node QB2 of a $n-1^{th}$ emission driver EMD(n-1).

The eighth transistor T8 includes a gate electrode connected to the QP node QP, a source electrode connected to the first clock signal input terminal CP1, and a drain electrode connected to the QB2 node QB2. When a voltage of the QP node QP is a turn-on voltage, the eighth transistor T8 applies a voltage of the first clock signal ECLK1 to the QB2 node QB2.

Both electrodes of the second capacitor C2 are respectively connected to the QP node QP and the QB2 node QB2. As a result, the QP node QP is bootstrapped according to change in a voltage of the QB2 node QB2.

The ninth transistor T9 includes a gate electrode connected to the first clock signal input terminal CP1, a source electrode connected to the QB2 node QB2, and a drain electrode connected to the QB1 node QB1. The ninth transistor T9 switches a current path between the QB2 node QB2 and the QB1 node QB1 according to a voltage level of the first clock signal ECLK1.

A QB node controller T5 and T10 includes the fifth transistor T5 and the tenth transistor T10.

The fifth transistor T5 includes a gate electrode connected to the Q1 node Q1, a source electrode connected to the QB1 node QB1, and a drain electrode connected to a high potential voltage VEH input terminal. When a voltage of the Q1 node is a turn-on voltage, the fifth transistor T5 charges the voltage of the QB1 node QB1 to a high potential voltage VEH which is a turn-off voltage.

The tenth transistor T10 includes a gate electrode connected to the Q1 node Q1, a source electrode connected to the QB2 node QB2, and a drain electrode connected to the high potential voltage VEH input terminal. When a voltage of the Q1 node Q1 is a turn-on voltage, the tenth transistor T10 charges a voltage of the QB2 node QB2 to a high potential voltage VEH which is a turn-off voltage.

Both ends of the third capacitor C3 are respectively connected to the QB1 node QB1 and an input terminal of the high potential voltage VEH. The third capacitor C3 may maintain a voltage of the QB1 node QB1 at a stable level, thereby enhancing operation reliability of the pull-down transistor T7.

In response to a voltage of the Q1 node Q1, the pull-up unit 400 applies a low potential voltage VEL, which is a turn-on voltage, to the output terminal Nout. The pull-up unit 400 may be implemented as a pull-up transistor T6 connected between the low potential voltage VEL input terminal and the output terminal Nout and having a gate electrode connected to the Q1 node Q1.

The pull-down unit 500 includes a pull-down transistor T7 that applies a high potential voltage VEH, which is a turn-off voltage, to the output terminal Nout in response to a voltage of the QB1 node QB1.

Figure 8:
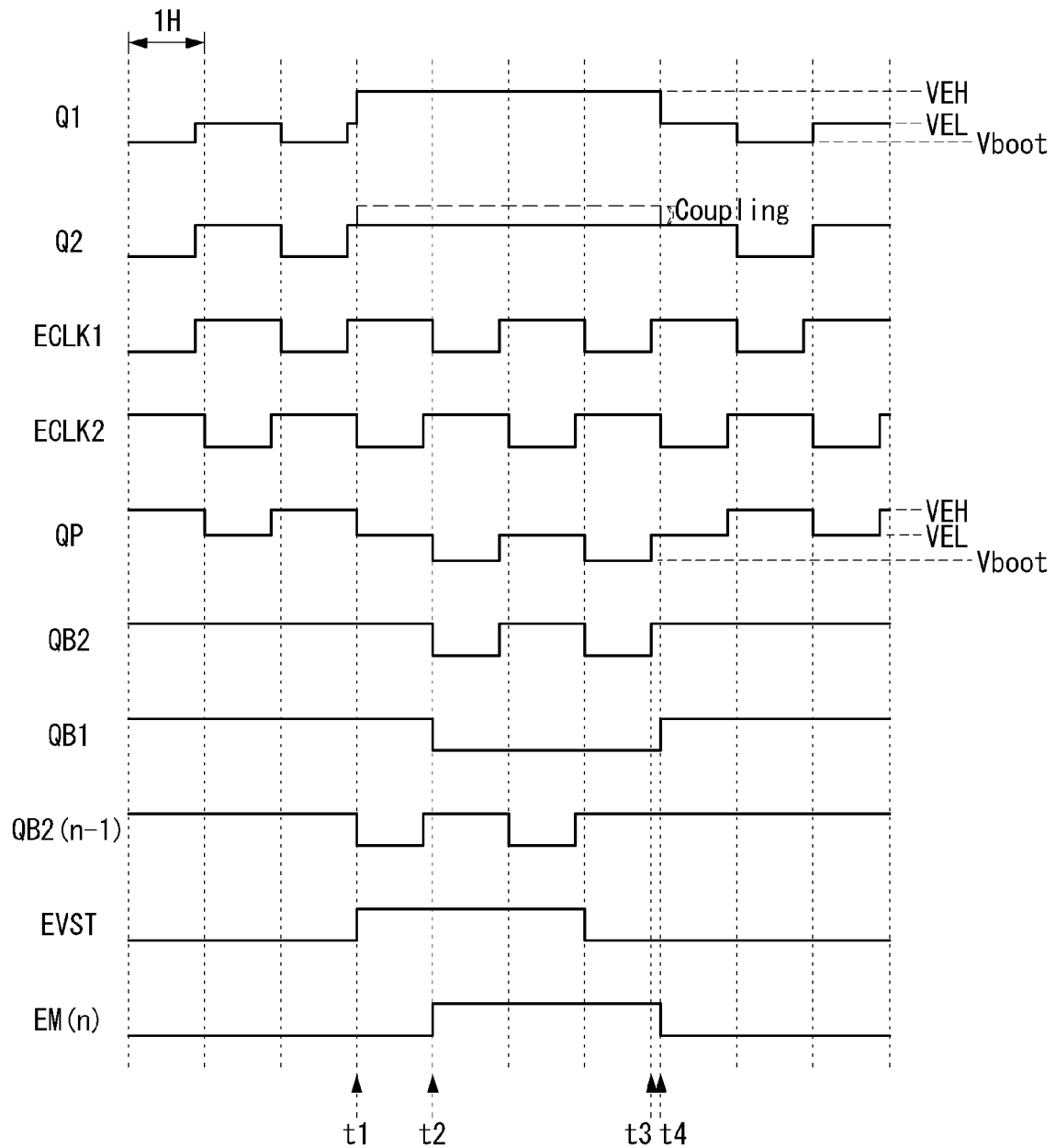
FIG. 8 is a diagram illustrating timings of clock signals applied to the emission driver shown in FIG. 7.

FIG. 8 is a diagram illustrating timings of clock signals applied to the $n^{th}$ emission driver shown in FIG. 7 and voltage change of major nodes.

With reference to FIGS. 7 and 8, when a voltage the Q1 node Q1 is a turn-on voltage equal to or lower than the low potential voltage VEL, the pull-up transistor T6 charges the output terminal Nout to the low potential voltage VEL. An emission signal EM(n) at a turn-on voltage is applied to an emission line of a $n^{th}$ pixel line (HLn) connected to the output terminal Nout. The Q1 node Q1 node is maintained at the low potential voltage VEL due to the first clock signal ECLK1 and the second clock signal ECLK2 which alternatively maintain the turn-on voltage. The first clock signal ECLK1 and the second clock signal ECLK2 are reverse-phase, and have a cycle of two horizontal periods (2H). However, the first clock signal ECLK1 and the second clock signal ECLK2 may have pulse widths designed to slightly overlap with each other in a section where a voltage level is reversed for operation margin.

In a section where the second clock signal ECLK2 and the start signal EVST are synchronized, the first transistor T1 is turned on to charge the Q1 node Q1 to the low potential voltage VEL.

In a section where the first clock signal ECLK1 is at the low potential voltage, the second transistor T2 charges the Q2 node Q2 to the low potential voltage VEL. In response to variation of the voltage of the Q2 node Q2 due to the first clock signal ECLK1, the Q1 node Q1 is bootstraps to a bootstrapping voltage (Vboot). As a result, the pull-up transistor T6 charges the output terminal Nout with the low potential voltage VEL which is a turn-on voltage, and the output terminal Nout outputs an emission signal EM(n) which is at a turn-on voltage level.

In a section where the Q1 node Q1 is at a turn-on voltage level, the fifth transistor T5 charges the QB1 node QB1 to the high potential voltage VEH which is a turn-off voltage, and the tenth transistor T10 charges the QB2 node QB2 to the high potential voltage VEH which is a turn-off voltage. As a result, in the section where the Q1 node Q1 is at a turn-on voltage level, the pull-down transistor T7 is stably maintained in a turn-off state.

At a first timing t1, the fourth transistor T4 applies a low potential voltage VEL, applied from a n-$1^{th}$ QB node (QB2 (n-1)), to the QP node QP. At the first timing t1, the second clock signal ECLK2 is reversed into a turn-on voltage, and accordingly, the first transistor T1 is turned on and the start signal EVST is reversed to the high potential voltage VEH. At the first timing t1, the Q1 node Q1 is increased to a turn-off voltage, and accordingly, the second transistor T2 is maintained in a turn-off state until a fourth timing t4 at which the start signal EVST and the second clock signal ECLK2 are synchronized. While the second transistor T2 is in the turn-off state, the Q2 node Q2 is able to maintain a voltage at a constant level, without being affected by voltage variation of the first clock signal ECLK1. Thus, a voltage of the Q1 node Q1 being coupled to the A2 node (A2) through the first capacitor C1 is able to be stably maintained as a turn-off voltage.

At a second timing T2, the eighty transistor T8 applies a low potential voltage of the first clock signal ECLK1 to the QB2 node QB2. In this case, the QP node QP is bootstrapped to a lower voltage level in response to variations in voltage of the QB2 node QB2. The ninth transistor T9 applies a voltage of the QB2 node QB2 to the QB1 node QB1 in response to the first clock signal ECLK1 of the low potential voltage VEL.

The pull-down transistor T7 charges the output terminal Nout to a turn-off voltage in response to the voltage of the QB1 node QB1.

At a second timing t2, the third transistor T3 applies the high potential voltage VEH to the Q1 node Q1 in response to the voltage of the QB2 node QB2, thereby helping the Q1 node Q1 to maintain the turn-off voltage.

At a third timing t3, the first clock signal ECLK1 is reversed to the high potential voltage VEH. Due to the high potential voltage VEH of the first clock signal ECLK1 applied via the eight transistor T8, the voltage of the QB node (QB2) becomes a high potential voltage VEH. At a fourth timing (T4), the start signal EVST and the second clock signal ECLK2 are again synchronized to a turn-on voltage, and, as a result, the low potential voltage VEL is applied to the Q1 node Q1.

As described above, the emission driver according to this specification controls the Q1 node Q1, which is a gate electrode of the pull-up transistor, using first and second clock signals (ECLK1, ECLK2). The second transistor T2 controls the Q1 node Q1 not by applying a turn-on voltage directly to the Q1 node Q1, but by applying a turn-on voltage to the Q2 node Q2 coupled to the Q1 node Q1. In addition, the gate electrode of the second transistor T2 is connected to the Q1 node Q1. Thus, in a section where the pull-up transistor is turned off, the second transistor T2 is turned off, and thus, direct coupling does not occur in the gate voltage of the pull-up transistor due to the first clock signal ECLK1.

When charging a Q node with first and second signals which are alternatively applied, a general gate driving circuit applies the clock signals directly to the Q node. Thus, the pull-up transistor is in a turn-off state, and thus, even when not applying a turn-on voltage to the Q node, the Q node is bootstrapped according to variations in voltage of the clock signals, so an unintended gate signal may be output.

On the contrary, the gate driving circuit according to this specification does not apply a turn-on voltage directly to the Q1 node Q1, which is a gate electrode of a pull-up transistor, but instead applies the turn-on voltage to the Q1 node Q1 via the Q2 node Q2, thereby turning off the second transistor T2 which connects the Q2 node Q2 and the Q1 node Q1 when the pull-up transistor is in a turn-off state. Therefore, when the pull-up transistor is in the turn-off state, the voltage of the Q2 node Q2 is stably maintained as a turn-off voltage, so that the pull-up transistor is prevented from malfunctioning.

Figure 9:
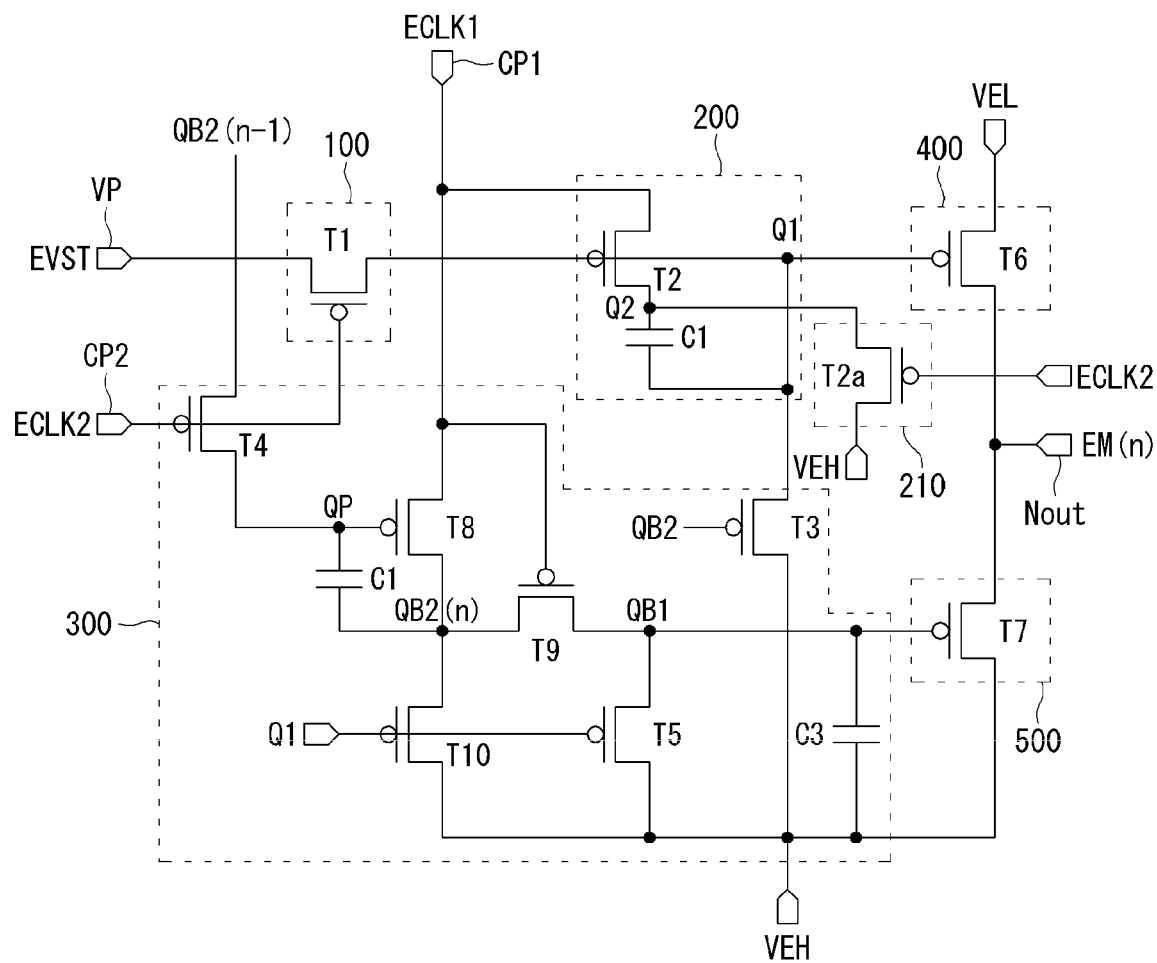
FIG. 9 is a diagram illustrating an emission driver according to a second embodiment of this specification.

FIG. 9 is a diagram illustrating a $n^{th}$ emission driver according to a second embodiment of this specification. Like components described in the above-described embodiment are indicated by like reference numerals, and detailed description thereof will be omitted or brief descriptions thereof will be provided.

With reference to FIG. 9, a $n^{th}$ emission driver EMD(n) includes a Q1 node charging unit 100, 200, and 210, a node controller 300, a pull-up unit 400, and a pull-down unit 500.

The Q1 node charging unit 100, 200, and 210 includes first and second charging units 100 and 200, and a Q2 node controller 210.

The first charging unit 100 (hereinafter, referred to as a first transistor) includes a gate electrode which receives a second clock signal ECLK2, a source electrode which is connected to a start signal input terminal VP providing a start signal EVST, and a drain electrode which is connected to a Q1 node Q1.

The second charging unit 200 includes a second transistor T2 and a first capacitor C1. The second transistor T2 includes a gate electrode connected to the Q1 node Q1, a source electrode connected to a first clock signal input terminal CP1, and a drain electrode connected to the Q2 node Q2. The first capacitor C1 is connected between the Q1 node Q1 and the Q2 node Q2.

The first capacitor C1 bootstraps a voltage of the Q2 node Q2 in response to a voltage of the Q1 node Q1. Alternatively, the first capacitor C1 bootstraps a voltage of the Q1 node Q1 in response to a voltage of the Q2 node Q2.

The Q2 node controller 210 applies an electric potential voltage to the Q2 node Q2 in a section where the Q1 node Q1 has a turn-off voltage. As the electric potential voltage, a high potential voltage VEH may be employed. The Q2 node controller 210 may be a transistor which including a gate electrode connected to the second clock signal input terminal CP2, a drain electrode connected to the Q2 node Q2, and a source electrode connected to an input terminal of the high potential voltage VEH. In this case, the Q2 node controller 210 may be a 2a transistor T2a.

Figure 10:
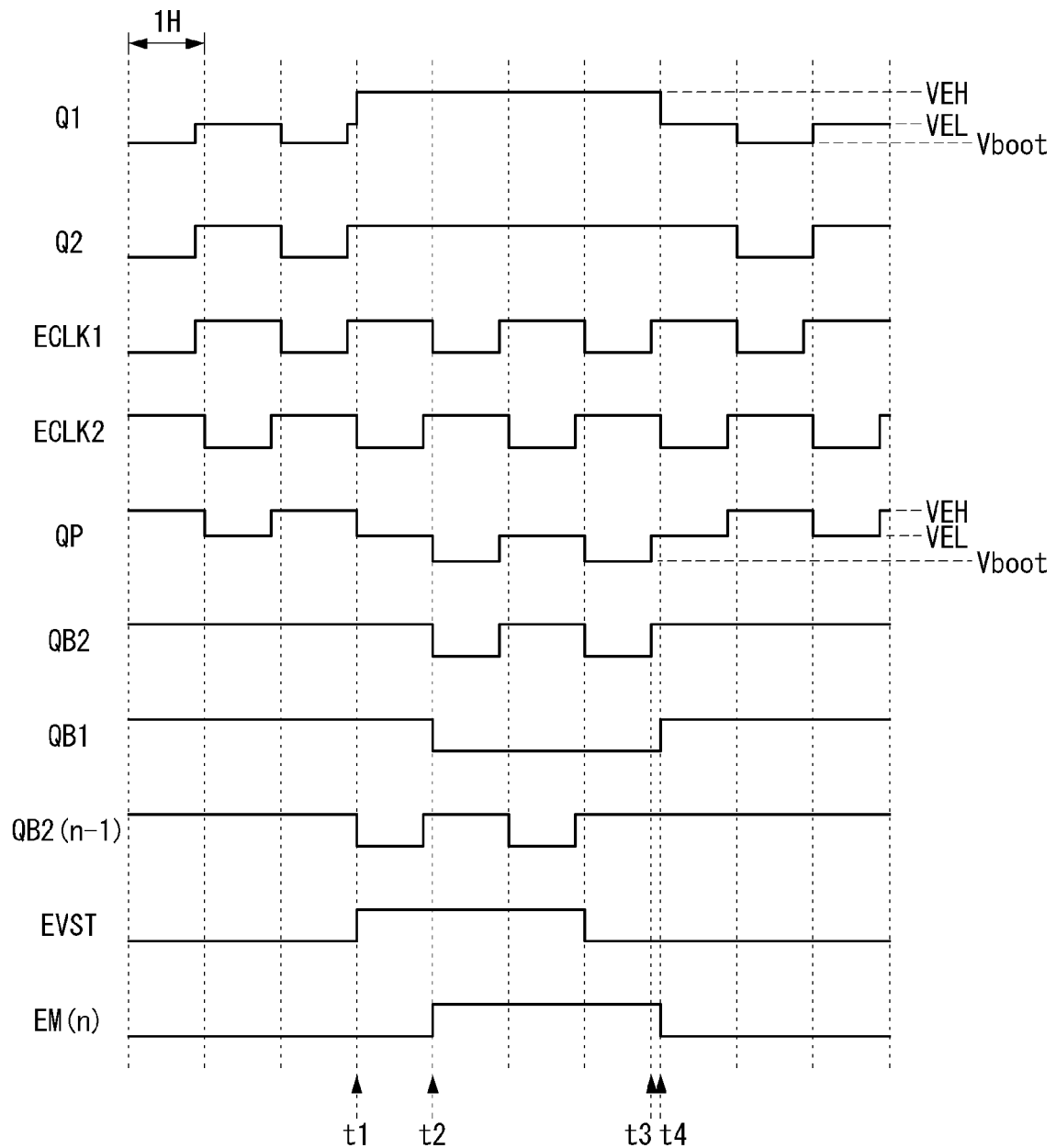
FIG. 10 is a diagram showing timings of clock signals for driving the emission driver shown in FIG. 9.

FIG. 10 is a diagram showing timings of clock signals for driving the emission driver shown in FIG. 9, and variations in voltage of major nodes. The timings of the first and second clock signals shown in FIG. 10 are identical to timings of the first and second clock signals shown in FIG. 8, and thus, the driving timing of the emission driver according to the second embodiment is identical to the driving timing of the first embodiment.

With reference to FIGS. 9 and 10, using the Q2 node controller 210, the emission driver according to the second embodiment may maintain the voltage of the Q2 node Q2 to be the high potential voltage VEH in a section where the Q1 node Q1 maintains the high potential voltage VEH.

The Q2 node controller 210 of the second embodiment is different from that of the first embodiment for the following characteristics.

In the first embodiment shown in FIG. 7, the Q2 node Q2 is coupled to the Q1 node Q1 via the first capacitor C1. Thus, as shown in FIG. 8, in a section where the voltage of the Q1 node Q1 increases, the voltage of the Q2 node Q2 may increase to a voltage level higher than the high potential voltage VEH due to the coupling phenomenon. A difference Vds between a drain voltage and a source voltage in the second transistor T2 corresponds to a difference between the voltage of the Q2 node Q2 and the voltage of the first clock signal ECLK1. If the voltage of the Q2 node Q2 increases to be higher than the high potential voltage VEH, Vds of the second transistor T2 increases in a section where the first clock signal ECLK1 is a low potential voltage (VEL). This may lead to faster degradation of the second transistor T2.

In addition, the Q2 node controller 210 of the second embodiment applies an electric potential voltage, for example, a high potential voltage VEH, to the Q2 node Q2 in a section where the voltage of the Q1 node Q1 increases. Thus, even though the voltage of the Q1 node Q1 increases, coupling phenomenon does not occur in the Q2 node Q2 and the Q2 node Q2 may be maintained at the high potential voltage VEH. For this characteristic, the second embodiment may prevent the second transistor T2 from being deteriorated fast.

Figure 11:
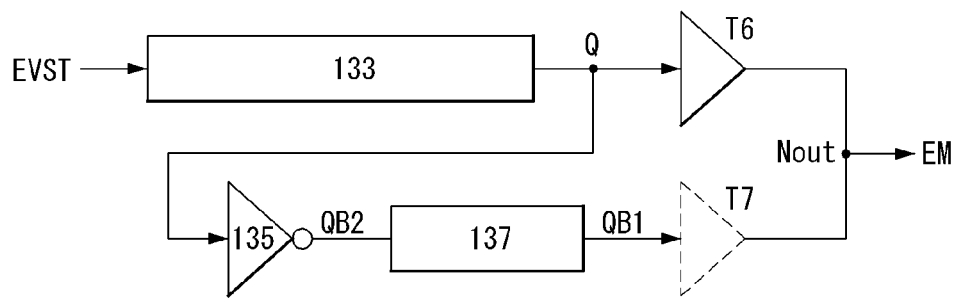
FIG. 11 is a block diagram illustrating configuration of an emission driver according to an comparative example.
Figure 12:
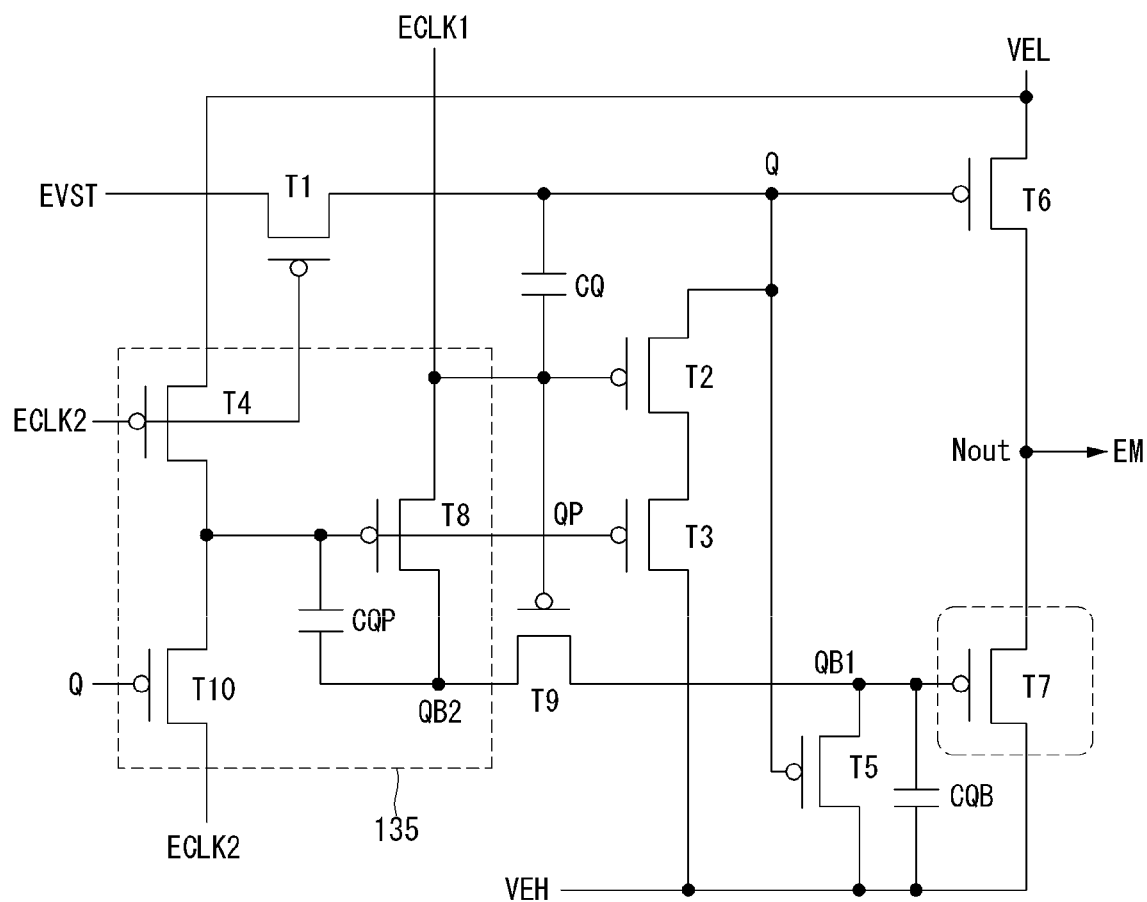
FIG. 12 is a diagram illustrating circuit configuration of the emission driver shown in FIG. 11.
Figure 13:
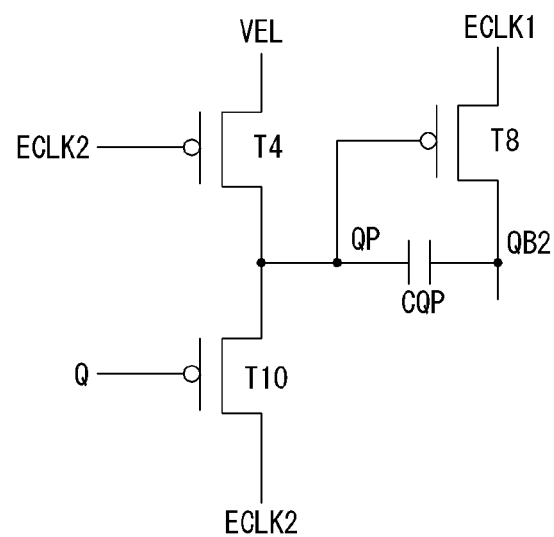
FIGS. 13 and 14 are diagrams showing circuit configuration and driving waveforms to explain operation characteristics related to a inverter shown in FIG. 12.
Figure 14:
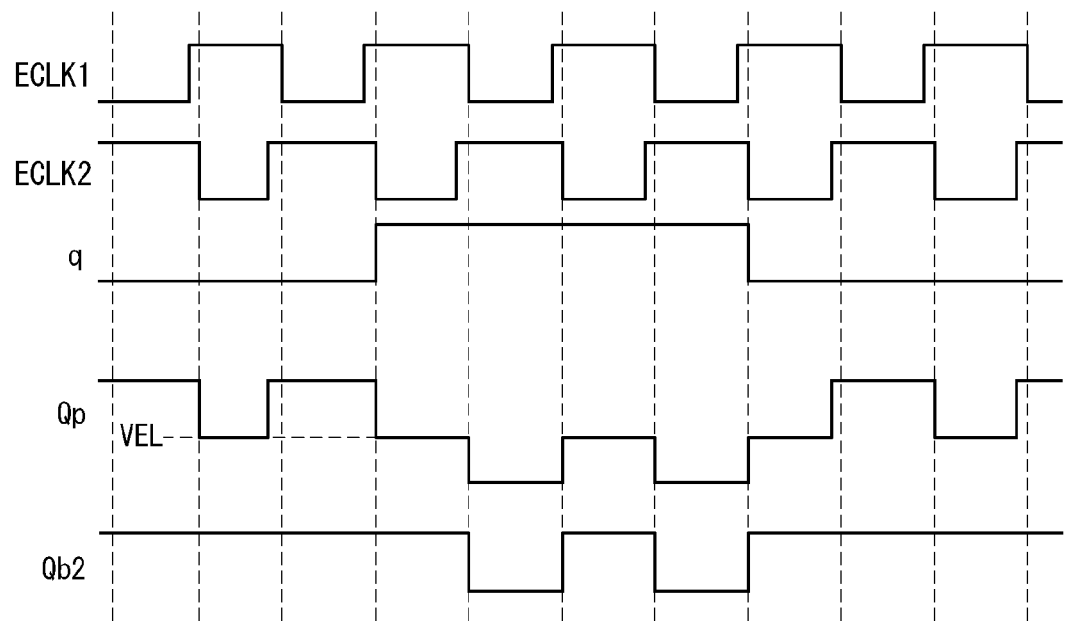

FIG. 11 is a block diagram illustrating configuration of a $n^{th}$ emission driver according to a comparative example, FIG. 12 is a diagram illustrating circuit configuration of the $n^{th}$ emission driver shown in FIG. 11, and FIGS. 13 and 14 are diagrams showing circuit configuration and driving waveforms to explain operation characteristics related to an inverter shown in FIG. 12.

As shown in FIG. 11, the $n^{th}$ emission driver according to the comparative example may include a Q1 node controller 133, a bootstrap inverter 135, a QB1 node controller 137, a first output buffer T6, a second output buffer T7, etc. Major components of the $n^{th}$ emission driver according to the comparative example will be described briefly in the following.

The Q node controller 133 controls a Q node Q based on a start signal EVST transferred via a start signal input terminal. The bootstrap inverter 135 controls a QB2 node QB2 based on an electric potential of the Q node Q. The QB1 node controller 137 controls the QB1 node QB1 based on an electric potential of the QB2 node QB2. The first output buffer T6 is turned on based on the electric potential of the Q node Q and outputs a logic-low emission signal through an output terminal Nout of the emission driver. The second output buffer T7 is turned on based on the electric potential of the QB1 node QB1 and outputs a logic-high emission signal through the output terminal Nout of the emission driver.

As illustrated in FIGS. 11 and 12, the $n^{th}$ emission driver according to the comparative example includes a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, a first capacitor CQ, a second capacitor CQP, and a third capacitor CQB.

The bootstrap inverter 135 includes the fourth transistor T4, the eighth transistor T8, the tenth transistor T10, and the second capacitor CQP. The bootstrap inverter 135 inverts signals or electric potentials input based on the fourth transistor T4, the eighth transistor T8, the tenth transistor T10, and the second capacitor CQP, and outputs the inverted signals or electric potentials. Other devices, except devices included in the bootstrap inverter 135, correspond to devices related to the Q node controller 133, the QB1 node controller 137, the first output buffer T6, and the second output buffer T7.

Hereinafter, with reference to FIGS. 13 and 14, the fourth transistor T4, the eighth transistor T8, the tenth transistor T10, and the second capacitor CQP included in the bootstrap inverter 135 shown in FIG. 12 will be further described.

The fourth transistor T4 includes a gate electrode connected to a second clock signal input terminal, a first electrode connected to a low potential voltage input terminal, and a second electrode connected to a QP node QP. The fourth transistor T4 is turned on in response to a second clock signal ECLK2 transferred via the second clock signal input terminal. When the fourth transistor T4 is turned on, the low potential voltage VEL transferred through the low potential voltage input terminal is applied to the QP node QP.

The tenth transistor T10 includes a gate electrode connected to the Q node Q, a first electrode connected to the second clock signal input terminal, and a second electrode connected to the QP node QP. The tenth transistor T10 is turned on in response to an electric potential q of the logic-low of the Q node Q. When the tenth transistor T10 is turned on, a second clock signal ECLK2 transferred through the second clock signal input terminal is applied to the QP node QP.

The eighth transistor T8 includes a gate electrode connected to the QP node QP, a first electrode connected to a first clock signal input terminal, and a second electrode connected to the QB2 node QB2. The eighth transistor T8 is turned on in response to an electric potential Qp of the QP node QP. When the eighth transistor T8 is turned on, the first clock signal ECLK1 transferred through the first clock signal input terminal is applied the QB2 node QB2.

The second capacitor CQP includes one end connected to the QP node QP, and the other end connected to the QB2 node QB2. The second capacitor CQP acts as a bootstrap capacitor which makes one of both side terminals to have a different electric potential.

The bootstrap inverter of the comparative example receives an electric potential q of the Q node Q. For this reason, when the electric potential q of the Q node Q is logic low and logic high, the bootstrap inverter exhibits different operation and output characteristics as below.

In a section where a logic-low electric potential is formed in the Q node Q, the tenth transistor T10 is maintained in a turn-on state. In this section, the fourth transistor T4 is repeatedly turned on and off by the second clock signal ECLK2 which changes between logic low and logic high.

Because the fourth transistor T4 is repeatedly turned on and off while the tenth transistor T10 is turned on, the electric potential of the QP node QP is changed between logic high and logic low as the same as the second clock signal ECLK2. On the other hand, due to turning on/off of the eighth transistor T8, a logic-high electric potential is maintained in the QB2 node QB2 all the time.

In a section where the logic-high electric potential is formed in the Q node Q, the tenth transistor T10 remains being turned off. In this section, the fourth transistor T4 is repeatedly turned on and off due to the second clock signal ECLK2 which changes between logic high and logic low.

Because the fourth transistor T4 is repeatedly turned on and off while the tenth transistor T10 is turned off, the QP node QP is maintained at the low potential voltage VEL, but a voltage may become lower than the low potential voltage due to the bootstrapping effect by the second capacitor CQP. As the eighth transistor T8 remains turned on, the electric potential of the QB2 node QB2 is changed to a logic-high level or a logic-low level as the same as the first clock signal ECLK1. In this case, the voltage of the QB2 node QB2 is not bootstrapped to a low potential voltage by the second capacitor CQP, and thus, the voltage of the QP node QP may become lower. Therefore, the first clock signal ECLK1 may be transferred to the QB2 node QB2 via the eighth transistor T8.

As such, like an inverter circuit, the comparative example inverts the electric potential q of the Q node Q, forming an electric potential to be applied to the QB2 node QB2. In addition, an electric potential Qb2 of the QB2 node QB2 is transferred to the QB1 node QB1 via a turned-on ninth transistor T9. In addition, a circuit is implemented so that a logic-high output of the second output buffer T7 is made based on the electric potential formed in the QB1 node QB1.

Figure 15:
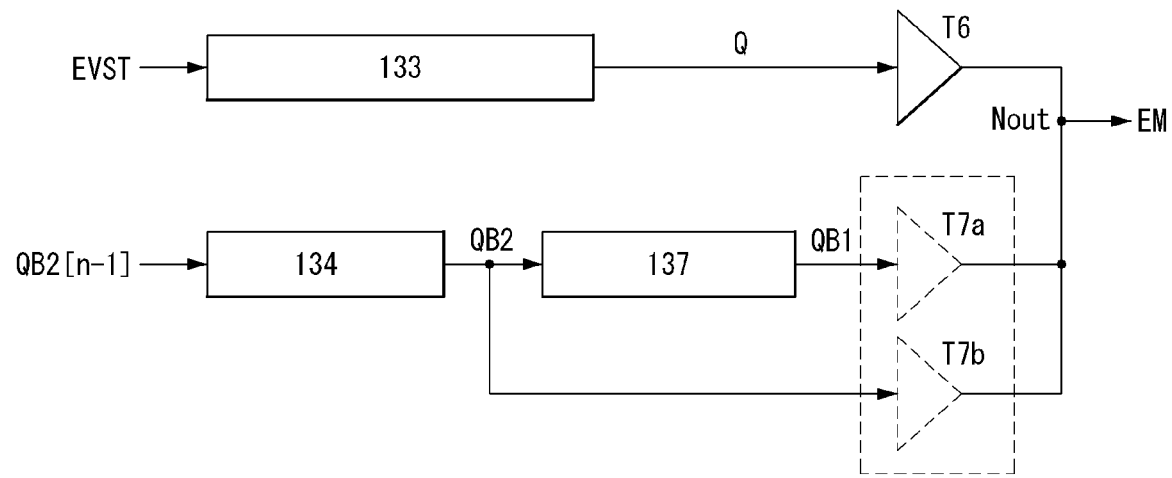
FIG. 15 is a block diagram illustrating configuration of a $n^{th}$ emission driver according to a third embodiment of this specification.
Figure 16:
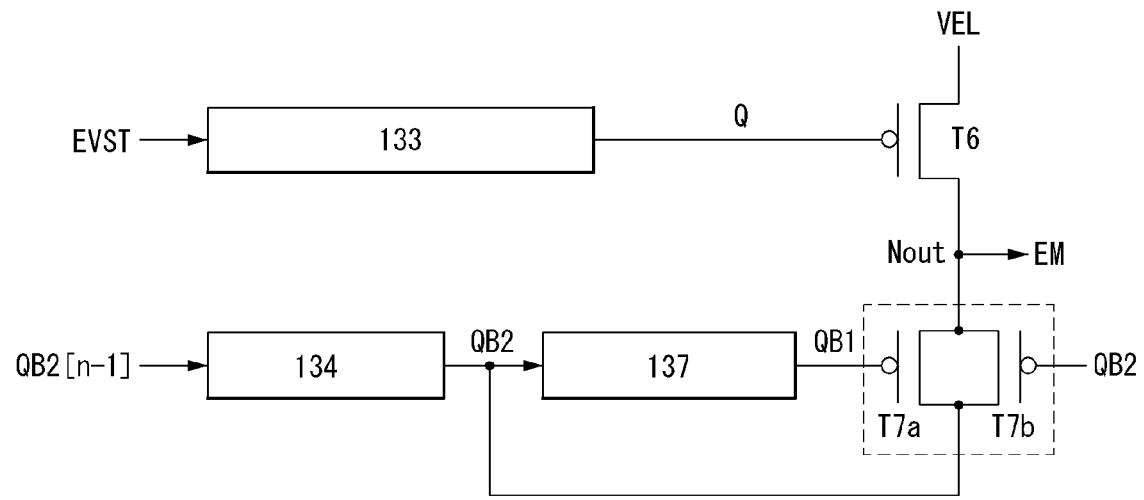
FIG. 16 is a diagram illustrating circuit configuration of an output buffer shown in FIG. 15.
Figure 17:
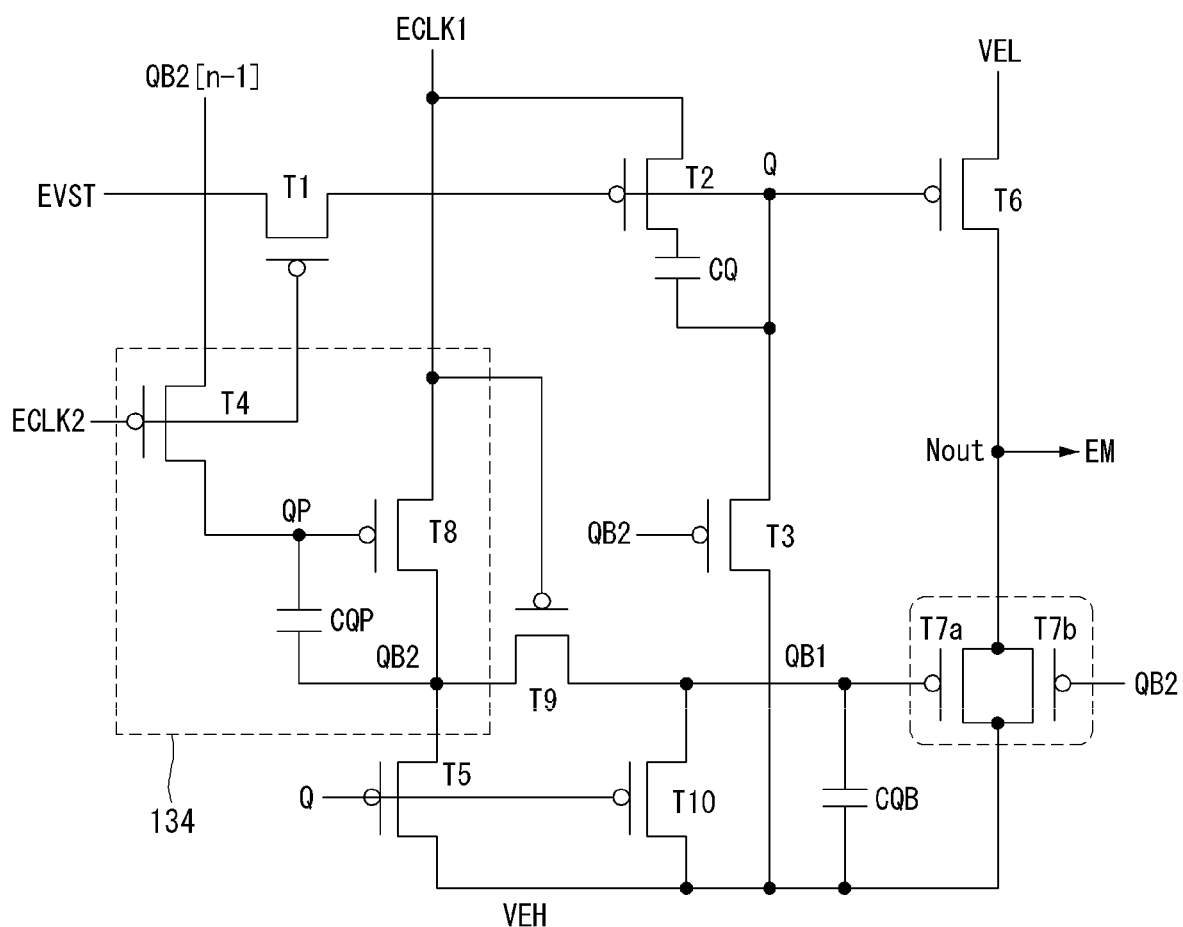
FIG. 17 is a diagram illustrating detailed circuit configuration of the $n^{th}$ emission driver according to the third embodiment of this specification.
Figure 18:
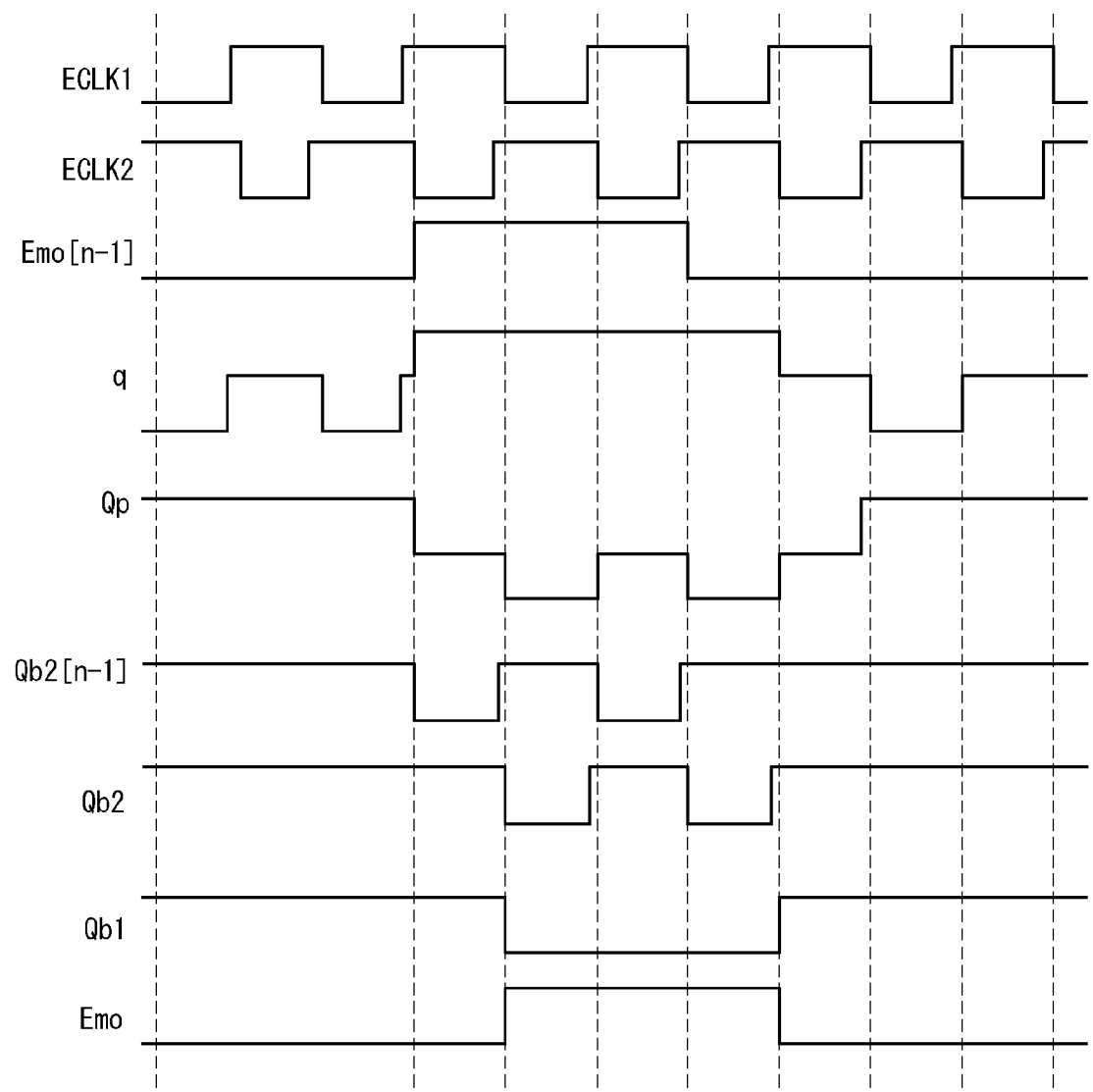
FIG. 18 is a waveform diagram illustrating the $n^{th}$ emission driver shown in FIG. 17.
Figure 19:
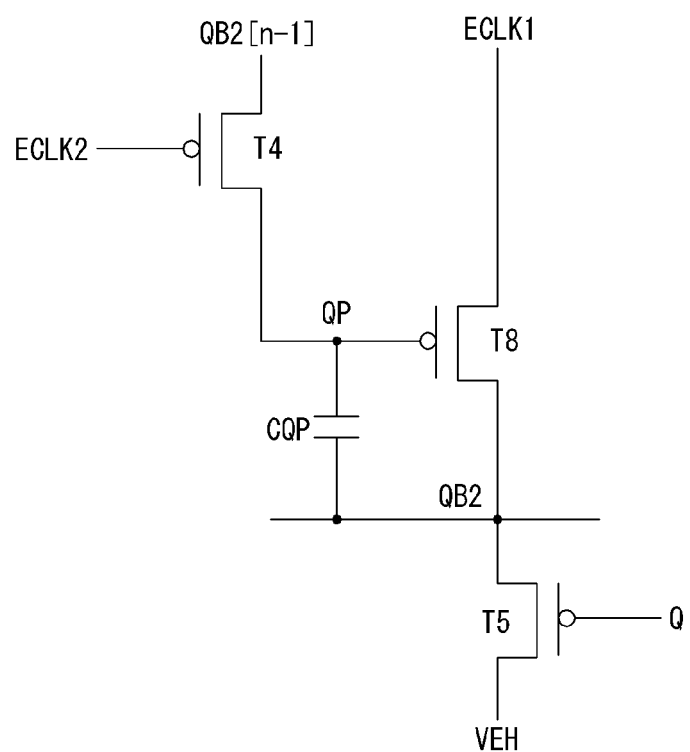
FIGS. 19 and 20 are diagrams illustrating circuit configuration and driving waveforms for explaining operation characteristics related to a QB2 node controller shown in FIG. 17.
Figure 20:
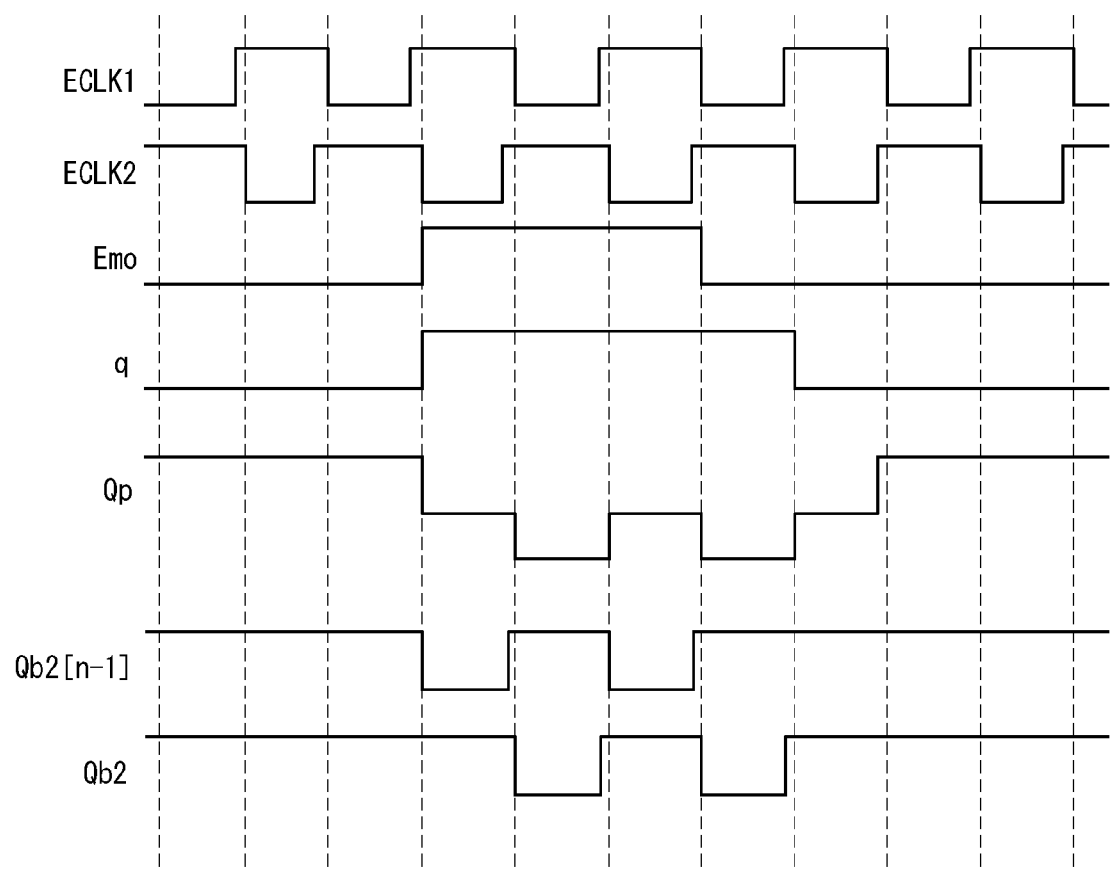
Figure 21:
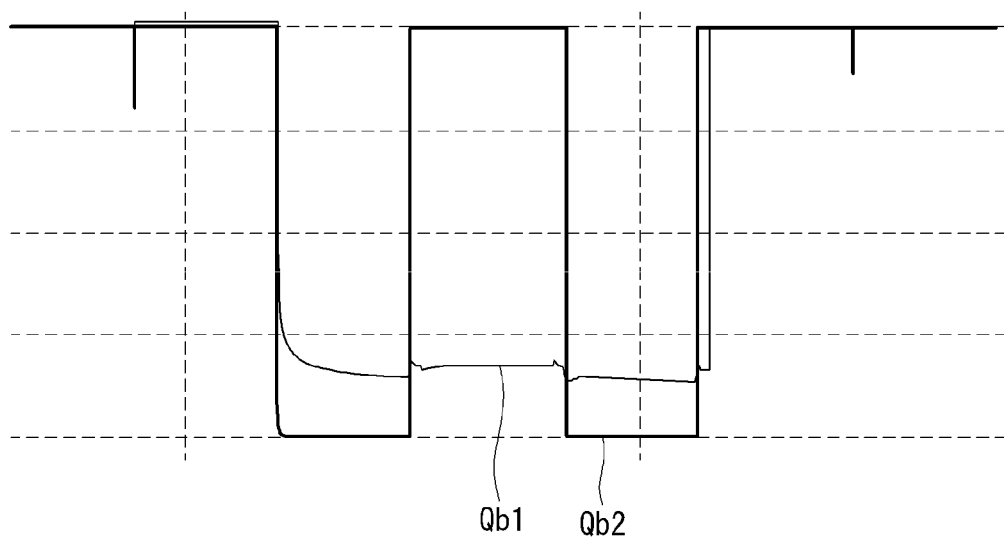
FIG. 21 is a diagram of voltage waveforms measured by a QB1 node and a QB2 node of the nth emission driver according to the third embodiment of this specification.

FIG. 15 is a block diagram illustrating configuration of a $n^{th}$ emission driver according to a third embodiment. FIG. 16 is a diagram illustrating circuit configuration of an output buffer shown in FIG. 15. FIG. 17 is a diagram illustrating detailed circuit configuration of the $n^{th}$ emission driver according to the third embodiment. FIG. 18 is a waveform diagram illustrating the $n^{th}$ emission driver shown in FIG. 17. FIGS. 19 and 20 are diagrams illustrating circuit configuration and driving waveforms for explaining operation characteristics related to a QB2 node controller shown in FIG. 17. FIG. 21 is a diagram illustrating voltage waveforms measured by a QB1 node and a QB2 node of the $n^{th}$ emission driver according to the third embodiment.

As illustrated in FIG. 15, the $n^{th}$ emission driver according to the third embodiment of this specification includes a Q node controller 133, a QB2 node controller 134, a QB1 node controller 137, a first output buffer T6, and a second output buffer T7a and T7b. Major components of the $n^{th}$ emission driver according to the third embodiment of this specification will be described briefly.

The Q node controller 133 controls a Q node Q based on a start signal EVST transferred through a start signal input terminal. The QB2 node controller 134 controls the QB2 node QB2 based on an electric potential of a n-$1^{th}$ QB2 node (QB[n-1]). The QB1 node controller 137 controls the QB1 node QB1 based on an electric potential of the QB2 node QB2. The n-$1^{th}$ QB2 node QB2[n-1] is a QB2 node of a n-$1^{th}$ emission driver positioned in the previous stage of the $n^{th}$ emission driver.

The first output buffer T6 is turned on based on an electric potential of the Q node Q and outputs a logic-low emission signal (a first emission signal) through an output terminal Nout of the $n^{th}$ emission driver. The second output buffer T7a and T7b is turned on based on electric potentials of different nodes and outputs a logic-high emission signal (a second emission signal) through the output terminal Nout of the $n^{th}$ emission driver.

The second output buffer T7a and T7b includes a pair of two transistors T7a and T7b. The pair of two transistors T7a and T7b has a parallel-connection structure in which gate electrodes of the two transistors are connected to different nodes while first electrodes of the two transistors are connected only to each other and second electrodes thereof are connected only to each other. The pair of two transistors T7a and T7b are turned on in response to electric potentials of different nodes but output the same signal, and thus, the pair of two transistors T7a and T7b may be defined as a double buffer.

As illustrated in FIG. 16, the second output buffer T7a and T7b includes a pair of 2-1 output buffer T7a and a 2-2 output buffer T7b which are connected to different nodes. The 2-1 output buffer T7a operates in response to an electric potential of the QB1 node QB1. The 2-2 output buffer T7b operates in response to an electric potential of the QB2 node QB2. The effect of the connection of the pair of 2-1 output buffer T7a and the 2-2 output buffer T7b to different nodes will be described later.

As illustrated in FIGS. 17 and 18, the $n^{th}$ emission driver according to the third embodiment includes a first transistor T1, a second transistor T2, a third transistor T3, a fourth transistor T4, a fifth transistor T5, a sixth transistor T6, a 7-1 transistor T7a, a 7-2 transistor T7b, an eighth transistor T8, a ninth transistor T9, a tenth transistor T10, a first capacitor CQ, a second capacitor CQP, and a third capacitor CQB.

The first transistor T1 includes a gate electrode connected to a second clock signal input terminal, a first electrode connected to a start signal input terminal, and a second electrode connected to a Q node Q. The first transistor T1 is turned on based on a second clock signal ECLK2 transferred through the second clock signal input terminal. When the first transistor T1 is turned on, a start signal EVST is applied to the Q node Q. In this case, the Q node Q is charged by the start signal EVST.

The second transistor T2 includes a gate electrode connected to the Q node Q, a first electrode connected to a first clock signal input terminal, and a second electrode connected to one end of the first capacitor CQ. The second transistor T2 is turned on based on an electric potential q of the Q node Q. When the second transistor T2 is turned on, a first clock signal ECLK1 is applied to one end of the first capacitor CQ. In this case, the first capacitor CQ is charged with a voltage to maintain the Q node Q in a particular state.

The third transistor T3 includes a gate electrode to a QB2 node QB2, a first electrode connected to the Q node Q, and a second electrode connected to a high potential voltage input terminal. The third transistor T3 is turned on an electric potential Qb2 of the QB2 node QB2. When the third transistor T3 is turned on, a high potential voltage VEH is applied to the Q node Q. In this case, the Q node Q is discharged by the high potential voltage VEH.

The fourth transistor T4 includes a gate electrode connected to the second clock signal input terminal, a first electrode connected to a n-1$^{th}$ QB2 node QB2[n-1], and a second electrode connected to a QP node QP. The fourth transistor T4 is turned on based on a second clock signal ECLK2 transferred through the second clock signal input terminal. When the fourth transistor T4 is turned on, an electric potential Qb2[n-1] of the n-1$^{th}$ QB2 node QB2[n-1] is applied to the QP node QP. The n-1$^{th}$ QB2 node QB2[n-1] is a QB2 node of a n-1$^{th}$ emission driver positioned in the front stage of the n$^{th}$ emission driver.

The fifth transistor T5 includes a gate electrode connected to the Q node Q, a first electrode connected to the QB2 node QB2, and a second electrode connected to the high potential voltage VEH input terminal. The fifth transistor T5 is turned on based on an electric potential q of the Q node Q. When the fifth transistor T5 is turned on, a high potential voltage is applied to the QB2 node QB2. In this case, the QB2 node QB2 is discharged by the high potential voltage.

The sixth transistor T6 includes a gate electrode connected to the Q node Q, a first electrode connected to a low potential voltage input terminal, and a second electrode connected to an output terminal Nout of the n$^{th}$ emission driver. The sixth transistor T6 is turned on based on an electric potential q of the Q node Q. When the sixth transistor T6 is turned on, a low potential voltage VEL is applied to the output terminal Nout of the n$^{th}$ emission driver. In this case, the n$^{th}$ emission driver outputs a logic-low emission signal through its own output terminal Nout.

The 7-1 transistor T7a includes a gate electrode connected to a QB1 node QB1, a first electrode connected to the output terminal Nout of the n$^{th}$ emission driver, and a second electrode connected to the high potential voltage input terminal. The 7-1 transistor T7a is turned based on an electric potential of the QB1 node QB1. When the 7-1 transistor T7a is turned on, a high potential voltage is applied to the output terminal Nout of the n$^{th}$ emission driver. In this case, the n$^{th}$ emission driver outputs a logic-high emission signal through the output terminal Nout.

The 7-2 transistor T7b includes a gate electrode connected to the QB2 node QB2, a first electrode connected to the output terminal Nout of the n$^{th}$ emission driver, and a second electrode connected to the high potential voltage input terminal. The 7-2 transistor T7b is turned on based on an electric potential of the n$^{th}$ emission driver. When the 7-2 transistor T7b is turned on, a high potential voltage is applied to the output terminal Nout of the n$^{th}$ emission driver. In this case, the n$^{th}$ emission driver outputs a logic-high emission signal through its own output terminal Nout.

The eighth transistor T8 includes a gate electrode connected to the QP node QP, a first electrode connected to the first clock signal input terminal, and a second electrode connected to the QB2 node QB2. The eighth transistor T8 is turned on based on an electric potential Qb2[n-1] of a n-1$^{th}$ QB2 node QB2[n-1] which is transferred through the fourth transistor T4. When the eighth transistor T8 is turned on, the first clock signal ECLK1 is applied to the QB2 node QB2.

The ninth transistor T9 includes a gate electrode connected to the first clock signal input terminal, a first electrode connected to the QB2 node QB2, and a second electrode connected to the QB1 node QB1. The ninth transistor T9 is turned on based on a first clock signal ECLK1 transferred through the first clock signal input terminal. When the ninth transistor T9 is turned, on, the QB2 node QB2 and the QB1 node QB1 becomes into a state in which currents can flow. In this case, the QB1 node QB1 is influenced by an electric potential Qb2 formed in the QB2 node QB2.

The tenth transistor T10 includes a gate electrode connected to the Q node Q, a first electrode connected to the QB1 node QB1, and a second electrode connected to the high potential voltage VEH input terminal. The tenth transistor T10 is turned on based on an electric potential of the Q node Q. When the tenth transistor T10 is turned on, a high potential voltage VEH is applied to the QB1 node QB1. In this case, the QB1 node QB1 is discharged by the high potential voltage VEH.

The first capacitor CQ includes one end connected to the second electrode of the second transistor T2, and the other end connected to the Q node Q and the first electrode of the third transistor T3. The first capacitor CQ maintains an electric potential of the Q node Q at a logic-high level after a logic-low emission signal is output.

The second capacitor CQP includes one end connected to the QP node QP, and the other end connected to the QB2 node QB2. The second capacitor CQP maintains a logic-low electric potential of the first clock signal ECLK1 at a low level based on an electric potential Qb2[n-1] of a n-1$^{th}$ QB2 node (QB[n-1]).

The third capacitor CQB includes one end connected to the QB1 node QB1, and the other end connected to the high potential voltage input terminal. The third capacitor CQB maintains an electric potential of the QB1 node QB1 at a logic-high level after a logic-high emission signal is output.

A Q node controller (Q Control) includes the first transistor T1, the second transistor T2, the third transistor T3, and the first capacitor CQ. A QB1 node controller QB1 Control includes the fifth transistor T5, the tenth transistor T10, and the third capacitor CQB. A QB2 node controller QB2 Control includes the fourth transistor T4, the eighth transistor T8, and the second capacitor CQP. The first output buffer T6 includes the sixth transistor T6. The second output buffer T7a and T7b includes the 7-1 transistor T7a and the 7-2 transistor T7b.

Hereinafter, with reference to FIGS. 19 to 21, the fourth transistor T4, the eighth transistor T8, and the second capacitor CQP included in the QB2 node controller 134 of FIG. 17 will be further described.

In the third embodiment, the QB2 node controller 134 receives an input of the electric potential Qb2[n-1] of the n-1$^{th}$ QB2 node QB2[n-1]. For this reason, the QB2 node controller 134 exhibits different operating and outputting characteristics when the electric potential Qb2[n-1] of the n-1$^{th}$ QB2 node QB2[n-1] is at a logic-high level and a logic-low level, and these will be described in the following.

In a section where a logic-high electric potential Qb2[n-1] is formed in the n-1$^{th}$ QB2 node QB2[n-1], the fourth transistor T4 is repeatedly turned on and off by a second clock signal ECLK2 which changes between logic high and logic low.

When the fourth transistor T4 is turned on, a logic-high electric potential Qb2[n-1] of the n-1$^{th}$ QB2 node QB2[n-1] is applied to the QP node QP. In this section, the eighth transistor T8 is turned off by the logic-high electric potential Qb2[n-1] of the n-1$^{th}$ QB2 node QB2[n-1]. In this case, the fifth transistor T5 accessing the QB2 node QB2 together with the eighth transistor T8 is turned on by a logic-low electric potential q of the Q node Q, and thus, the fifth transistor T5 is maintained at a logic-high level.

In a section where a logic-low electric potential Qb2[n-1] is formed in the n-1$^{th}$ QB2 node QB2[n-1], the eighth transistor T8 is turned on by the logic-low electric potential Qb2[n-1] of the n-1$^{th}$ QB2 node QB2[n-1]. As the eighth transistor T8 is turned on, a first clock signal ECLK1 is applied to the QB2 node QB2 and the QB2 node QB2 synchronized with the first clock signal ECLK1 changes the electric potential of the QB node QB to be lower than the previously-formed logic low level. In this case, the fifth transistor T5 accessing the QB2 node QB2 together with the eighth transistor T8 is turned off by a logic-high potential q of the Q node Q, and thus, the fifth transistor T5 is maintained at a logic-low level. While these operations are performed, the QB2 node QB2 experiences a low-potential voltage bootstrapping effect by the second capacitor CQP, and therefore, the logic-low electric potential of the second clock signal ECLK2 is maintained more stably.

As such, the above embodiment includes the QB2 node controller 134 which moves the electric potential Qb2[n-1] of the n-1$^{th}$ QB2 node QB2[n-1], like a shift register, and applies the electric potential Qb2[n-1] to the QB2 node QB2. In addition, the above embodiment allows a logic-high output to be output through the 2-1 output buffer T7a based on the electric potential Qb1 of the QB1 node QB1, and allows a logic-high output to be output through the 2-2 output buffer T7b based on the electric potential Qb2 of the QB2 node QB2.

As shown in FIG. 21, the electric potential Qb1 of the QB1 node QB1 is transferred from the QB2 node QB2 by the turned-on a ninth transistor T9, and thus, there is an electric potential drop by the ninth transistor T9. However, because the electric potential Qb2 of the QB2 node QB2 exists in the QB2 node QB2 without passing through the turned-on a ninth transistor T9, there is no an electric potential drop as great as the electric potential Qb1 of the QB1 node QB1. Thus, the 2-2 output buffer T7b operates based on an electric potential which has not dropped compared to the 2-1 output buffer T7a. Thus, in the above embodiment, even though outputting characteristics of the 2-1 output buffer T7a is degraded, the degradation may be compensated by an output of the 2-2 output buffer T7b.

The third embodiment includes the second output buffer T7a and T7b based on at least two 7-1 and 7-2 transistors T7a and T7b. The second output buffer T7 according to the comparative example may include a second output buffer T7 slightly large in size (width and length, or a WL value) for stable outputting and holding of a logic-high signal. However, the second output buffer T7a and T7b according to the third embodiment includes two transistors connected in parallel, and it may be smaller in size (width and length, or a WL value) than the second output buffer T7

Compared to the comparative example, the third embodiment may reduce the size (width and length, or a WL value) of the 7-1 and 7-2 transistors T7a and T7b. In this case, the reduced size of the second output buffer T7a and T7b may be advantageous in implementing a narrow bezel of a display panel. In addition, it is possible to rule out the possibility of reduction in a driving margin due to shift of a threshold voltage of the second output buffer T7a and T7b, and therefore, even when a threshold voltage shift Vth Shift occurs in any one transistor of the second output buffer T7a and T7b, it is possible to offset and compensate for the threshold voltage shift by the other transistor.

In addition, in an emission driver based on an inverter circuit as in the comparative example, the fourth transistor T4 is repeatedly turned on and off in response to a second clock signal, charging and discharging occurs in the second capacitor CQP, influenced by the fourth transistor T4, due to a constant voltage shift. However, in the emission driver based on a shift register as in the embodiment of the present disclosure, the second capacitor CQP is provided not to be affected by the second clock signal and thus charging and discharging hardly occur due to a voltage shift. Therefore, since charging and discharging of the second capacitor CQP of the embodiment is not greatly affected by load of a clock signal input terminal, it is possible to solve a signal delay caused by the load of the clock signal input terminal.

Thus, this specification may improve driving capabilities of transistors and maintain outputting characteristics of the transistors, and may provide an embedded gate driving circuit advantageous in implementing a narrow bezel. In addition, even though a threshold voltage of a transistor acting as an output buffer shifts, this specification may compensates for a threshold voltage and thus maintain proper outputting, thereby improving driving reliability.

Figure 22:
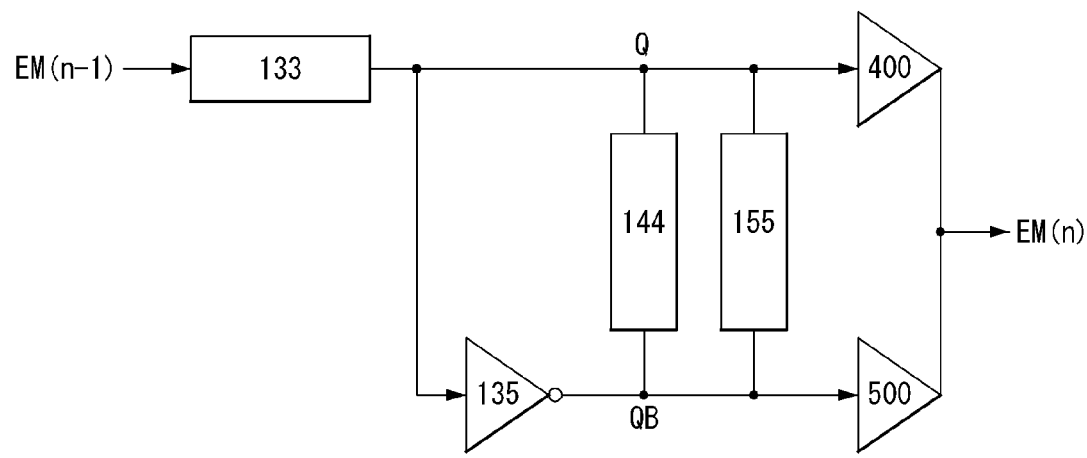
FIG. 22 is a block diagram illustrating an $n^{th}$ emission driver according to a fourth embodiment of this specification.

FIG. 22 is a block diagram illustrating a n$^{th}$ emission driver according to a fourth embodiment of this specification. FIG. 22 will be described by taking an example of the n$^{th}$ emission driver EMD(n).

With reference to FIG. 22, the n$^{th}$ emission driver EMD(n) includes a pull-up unit 400, a pull-down unit 500, a Q node controller 133, a Q node stabilizer 144, a QB node stabilizer 155, and an inverter 135. Among them, the Q node stabilizer 144 and the QB node stabilizer 155 may be omitted.

The pull-up unit 400 outputs a n$^{th}$ emission signal EM(n) in response to a voltage of a Q node Q, and the pull-down unit 400 controls the n$^{th}$ emission signal EM(n) to a turn-off voltage in response to a voltage of at least one of the Q node Q or the QB node QB.

The Q node controller 133 is a component for charging or discharging the Q node Q Q, and the Q node controller 133 applies a turn-on voltage to the Q node Q by using a n-1$^{th}$ emission signal EM(n-1), which is an output signal of the n-1$^{th}$ emission driver EMD(n-1), as a start signal.

The inverter 135 receives a signal from the Q node controller 133, for example, a signal applied to the Q node Q, inverts the received signal, and outputs the inverted signal to the QB node QB. While the Q node controller 133 outputs a turn-on voltage to the Q node Q, the inverter 135 outputs a turn-off voltage to the QB node QB. In addition, while the Q node controller 133 outputs a turn-off voltage to the Q node Q, the inverter 135 outputs a turn-on voltage to the QB node QB. The inverter 135 includes a QB' node controlled by a voltage of the Q node Q, and a QB' node controlled by the voltage of the Q node Q to output a voltage to the QB node QB. The inverter 135 includes a transistor having a gate connected to the Q' node, a drain connected to the QB' node, and a source to which an emission signal is applied, and a capacitor having one electrode connected to the gate and drain of the transistor. When the Q' node has a turn-on voltage, an emission-low voltage of an emission clock signal is applied to the QB' node through the transistor. The voltage applied to the Q' node is controlled by the Q node to constantly swing between a logic high voltage and a logic low voltage, whereas the voltage applied to the QB' node is maintained to be a logic high voltage. Accordingly, the capacitor connected to the Q' node and the QB' node included in the inverter of the emission driver may constantly perform charging and discharging. Thus, in a section where the emission driver needs to stably output a gate-high voltage, the voltage shakes. In addition, load of the emission clock signal may increase due to increased resolution of the display panel 10, and the emission clock signal may be distorted due to constant charging and discharging of the capacitor. In addition, when the emission clock signal line is formed in a display panel, the load of the emission clock signal may greatly change if the display panel has high resolution. Another embodiment of this specification for solving this problem will be described in the following.

While the n$^{th}$ emission signal EM(n) outputs a turn-off voltage, the Q node stabilizer 144 applies a high potential voltage VEH to the Q node Q, thereby stably maintaining a turn-off voltage.

While the n$^{th}$ emission signal EM(n) outputs a turn-on voltage, the QB node stabilizer 155 applies a high potential voltage VEH to the QB node QB, thereby stably maintaining a turn-off voltage. In this case, the high potential voltage VEH may be a logic high voltage VH.

Figure 23:
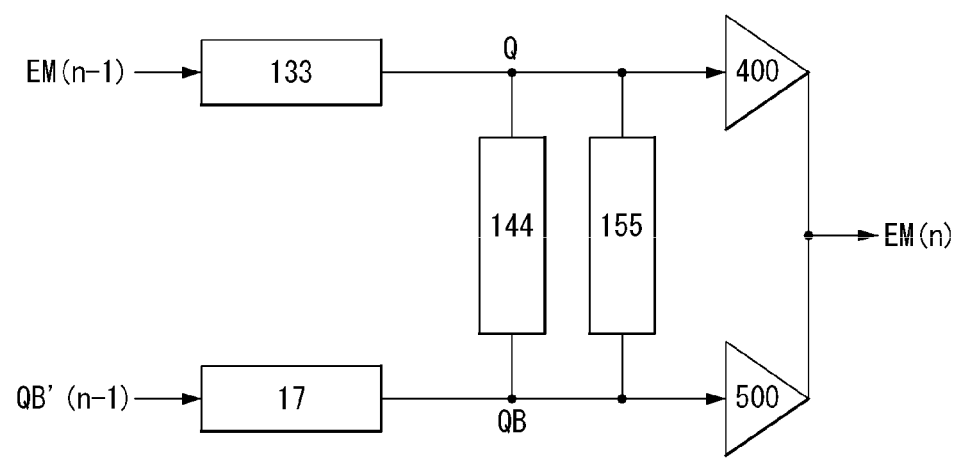
FIG. 23 is a block diagram illustrating an $n^{th}$ emission driver according to a fifth embodiment of this specification.

FIG. 23 is a block diagram illustrating a n$^{th}$ emission driver according to a fifth embodiment of this specification. FIG. 23 is described by taking an example of a n$^{th}$ emission driver EMD(n) which constitutes n$^{th}$ emission driver.

With reference to FIG. 23, the n$^{th}$ emission driver EMD(n) includes a pull-up unit 400, a pull-down unit 500, a Q node controller 133, a Q node stabilizer 144, a QB node stabilizer 155, and a QB node adjuster 17. Among them, the Q node stabilizer 144 and the QB node stabilizer 155 may be omitted.

The pull-up unit 400 outputs a n$^{th}$ emission signal EM(n) in response to a voltage of a Q node Q, and the pull-down unit 500 controls the n$^{th}$ emission signal EM(n) to a turn-off voltage in response to a voltage of at least one of the Q node Q or a QB node QB. For example, the pull-up unit 400 may include a single transistor or may include a transistor and a capacitor. The pull-down unit 500 may include a single transistor, may include a transistor and a capacitor, or may include a plurality of transistors and a capacitor. In this case, a gate of a transistor included in the pull-up unit 400 is connected to the Q node Q, and a gate of a transistor included in the pull-down unit 500 is connected to the QB node QB.

The Q node controller 133 is a component for charging or discharging the Q node Q. The Q node controller 133 applies a turn-on voltage to the Q node Q using a n-1$^{th}$ emission signal EM(n-1) which is an output signal of a n-1$^{th}$ emission driver EM(n-1).

The QB node adjuster 17 receives a signal applied to a QB' node QB'(n-1) of the n-1$^{th}$ emission driver EM(n-1), shifts the signal as much as a cycle of an emission clock signal, and outputs the signal to the QB' node. The QB node adjuster 17 may include a shift register. While the QB' node QB'(n-1) of the n-1$^{th}$ emission driver maintains a turn-off voltage, the QB node adjuster 17 discharges the QB' node and the QB node QB to the turn-off voltage. When the QB' node QB'(n-1) of the n-1$^{th}$ emission driver periodically changes between a turn-off voltage and a turn-on voltage, the QB node adjuster 17 applies a voltage of the QB' node QB'(n-1) of the n-1$^{th}$ emission driver EM(n-1) to the QB node. In this case, the QB' node is a node included in the QB node adjuster 17, and the QB' node and the QB node QB are connected to each other via a transistor. Similarly, the QB' node QB'(n-1) of the n-1$^{th}$ emission driver EM(n-1) is a node included in the QB node adjuster 17 which constitutes a previous stage. As the QB node adjuster 17 is configured, it is possible to solve a problem triggered by increased load of an emission clock signal, and to reduce occurrence of distortion of an emission clock signal caused by constant charging and discharging of a capacitor.

While the n$^{th}$ emission signal EM(n) outputs a turn-off voltage, the Q node stabilizer 144 applies a high potential voltage VEH to the Q node, thereby stably maintaining the turn-off voltage.

While the n$^{th}$ emission signal EM(n) outputs a turn-on voltage, the QB node stabilizer 155 applies a high potential voltage VEH to the QB node QB, thereby stably maintaining a turn-off voltage. In this case, the high potential voltage VEH may be a logic high voltage VH.

According to the fifth embodiment of this specification, the QB node is not inverted to a structure for controlling a QB node included in an emission driver. Instead, the QB node adjuster is additionally provided to control the QB node, and applies a voltage to the QB node. Accordingly, it is possible to reduce influence of increased load of an emission clock signal. In addition, because an inverter is not configured, it is possible to solve the problem that a voltage shakes in a section where the emission driver needs to output a gate high voltage stably.

Figure 24:
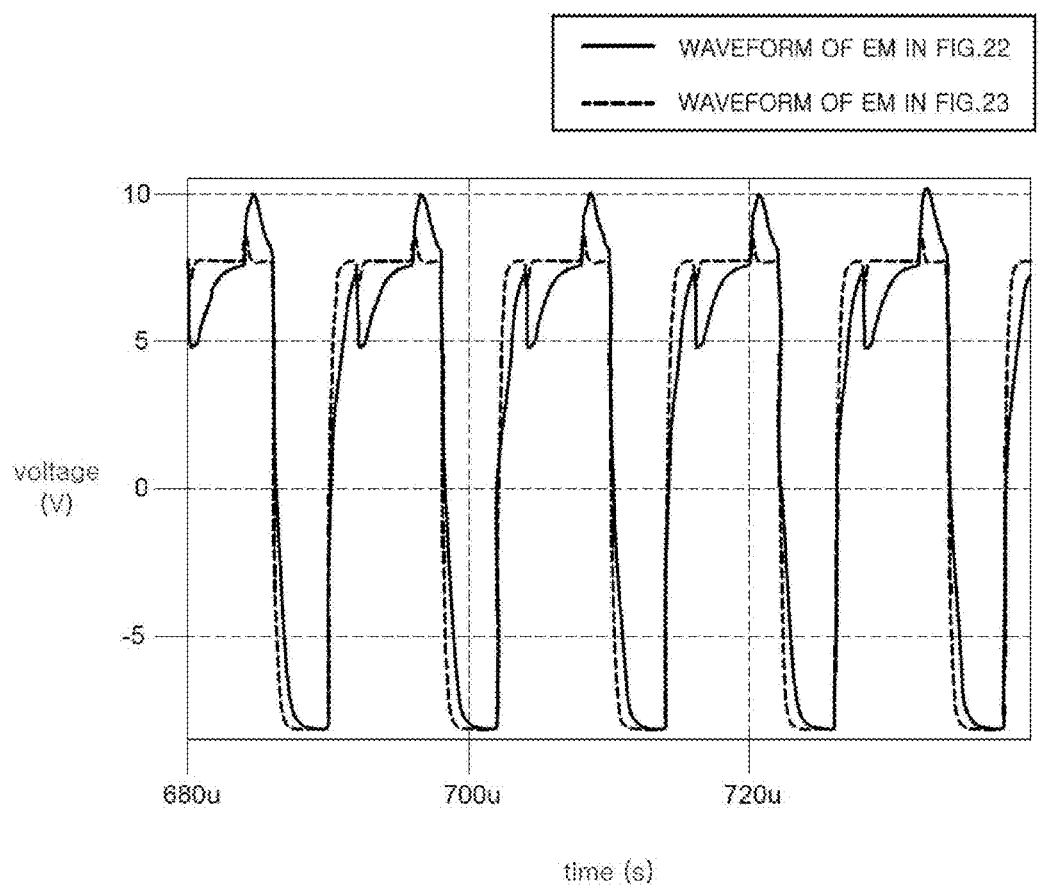
FIG. 24 is a graph showing output waveforms of an emission driver shown in FIGS. 22 and 23.

FIG. 24 is a graph showing output waveforms of an emission driver shown in FIGS. 22 and 23.

With reference to FIG. 24, an emission signal output from the emission driver of FIG. 22 is greatly distorted not just in a transient section where the emission signal shifts from a logic low voltage to a logic high voltage, but also in a normal section where the emission signal is maintained as a logic high voltage. However, an emission signal output from the emission driver of FIG. 23 according to another embodiment of this specification is less distorted, compared to the emission signal output from the emission driver of FIG. 22. For example, emission signals EM output from the emission driver of FIGS. 22 and 23 are a turn-on voltage of −9V and a turn-off voltage of +7.5V, but an emission signal output from the emission driver of FIG. 22 increases up to the turn-on voltage of −10V and drops up to the turn-off voltage of +5V in the transient section. Thus, it is found that the emission driver of FIG. 23 is effective in outputting a constant turn-off voltage.

Figure 25:
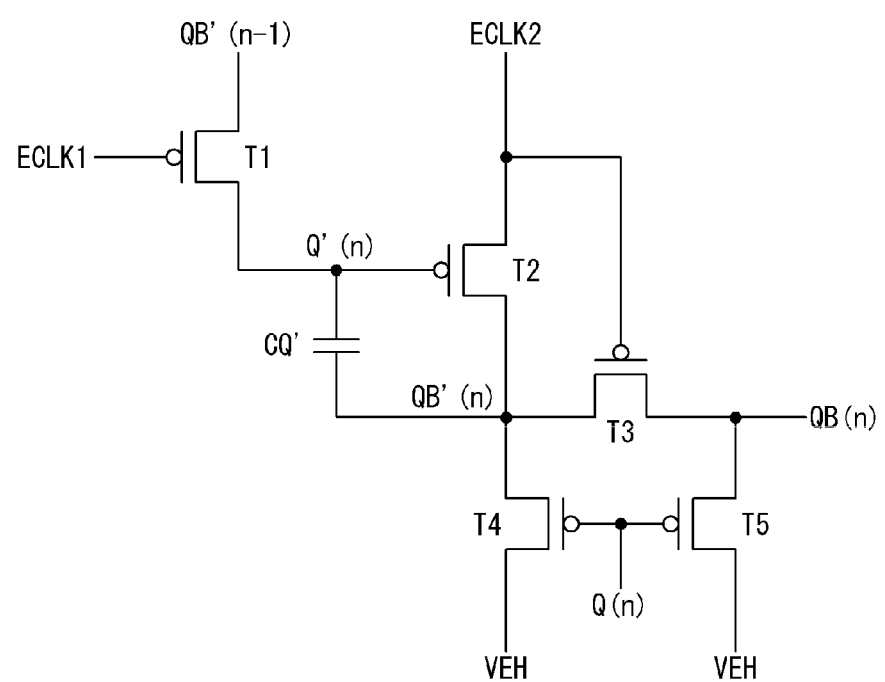
FIG. 25 is a circuit diagram of a QB node adjuster according to a first embodiment of this specification.

FIG. 25 is a circuit diagram of a QB node adjuster according to a first embodiment of this specification. FIG. 25 will be described by taking an example of a QB node adjuster included in a n$^{th}$ emission driver EMD(n).

A QB node adjuster 17-1 includes a Q'(n) node controller, a QB'(n) node controller, a QB(n) node controller, a QB(n) holder, and a QB'(n) holder, and a capacitor CQ'. Among them, the Q'(n) node controller, the QB'(n) node controller, and the QB(n) node controller may be in combination referred to as a QB(n) node charging unit.

A Q'(n) node controller 17-1 is configured as a first transistor T1. The first transistor T1 includes a gate connected to a second clock signal line to which a second clock signal ECLK2 is input, a source connected to a n-1$^{th}$ QB' node QB'(n-1), and a drain connected to a n$^{th}$ Q' node Q'(n). In a section where the second clock signal ECLK2 and the n-1$^{th}$ QB' node QB'(n-1) have a turn-on voltage, the first transistor T1 charges the n$^{th}$ Q' node Q'(n) to a low potential voltage VEL which is a turn-on voltage.

The QB'(n) node controller is configured as a second transistor T2. The second transistor T2 includes a gate connected to a n$^{th}$ Q' node Q'(n), a source connected to a first clock signal line to which a first clock signal ECLK1 is input, and a drain connected to a n$^{th}$ QB' node QB'(n). When the n$^{th}$ Q' node Q'(n) has a turn-on voltage, the second transistor T2 applies the first clock signal ECLK1 to a n$^{th}$ QB' node QB'(n).

Both electrodes of the capacitor CQ' are respectively connected to the n$^{th}$ Q' node Q'(n) and the n$^{th}$ QB' node QB'(n). The capacitor CQ' bootstraps the n$^{th}$ Q' node Q'(n) according to change in a voltage of the n$^{th}$ QB' node QB'(n).

The QB(n) node controller is configured as a third transistor T3. The third transistor T3 includes a gate connected to the first clock signal line to which the first clock signal ECLK1 is input, a source connected to the n$^{th}$ QB' node QB'(n), and a drain connected to the n$^{th}$ QB node QB(n). The third transistor T3 controls short in the n$^{th}$ QB' node QB'(n) and the n$^{th}$ QB node QB(n) in accordance with the first clock signal ECLK1.

The QB(n) node holding unit is configured as a fifth transistor T5. The fifth transistor T5 includes a gate connected to the n$^{th}$ Q node Q(n), a source connected to the n$^{th}$ QB node QB(n), and a drain connected to an emission high voltage line to which a high potential voltage VEH is input. When the n$^{th}$ Q node Q(n) has a turn-on voltage, the fifth transistor T5 discharges the n$^{th}$ QB node QB(n) to the high potential voltage VEH.

The QB'(n) node holding unit is configured as a fourth transistor T4. The fourth transistor includes a gate connected to the n$^{th}$ Q node Q(n), a source connected to the n$^{th}$ QB' node QB'(n), and a drain connected to the emission high voltage line to which the high potential voltage VEH is input. When the n$^{th}$ Q node Q(n) has a turn-on voltage, the fourth transistor T4 discharges the n$^{th}$ QB' node QB'(n) to the high potential voltage VEH.

As the QB node adjuster 17-1 according to the first embodiment of this specification implements a shift circuit, which inputs a signal of a previous-stage QB' node, in a bootstrapping manner, it is possible to reduce the influence of increased load of an emission clock signal and stably perform outputting of a QB node. A driving method of the QB node adjuster 17-1 according to the first embodiment of this specification will be described later.

Figure 29:
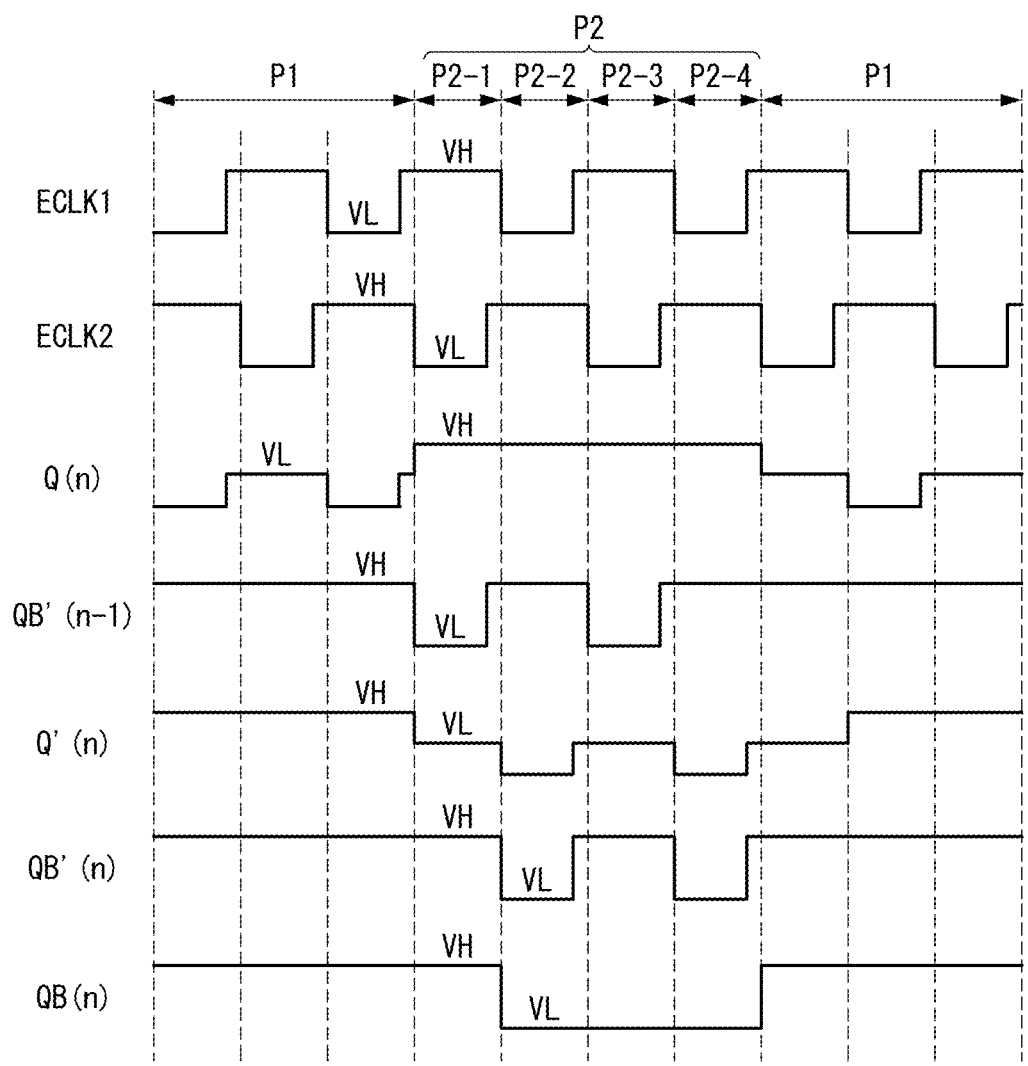
FIG. 29 is a diagram showing a driving waveform of a QB node adjuster according to an embodiment of this specification.

FIG. 29 is a driving waveform diagram of a QB node adjuster according to the first embodiment of this specification. In addition, FIG. 29 is a driving waveform diagram of FIG. 25.

With reference to FIGS. 25 and 29, in a first period P1 in which a signal of the n-1$^{th}$ QB' node QB'(n-1), which is a QB' node in a previous stage EMD(n-1), is maintained at a logic high voltage VH, the first transistor T1 is periodically turned on by the second clock signal ECLK2 and applies the logic high voltage VH to the n$^{th}$ Q' node Q'(n). Thus, during the first period P1, the first transistor T1 turns off the second transistor T2. In addition, in the first period P1, the Q node controller 133 applies a turn-on voltage to the n$^{th}$ Q node Q(n) in accordance with a turn-on voltage alternatively applied by the second clock signal ECLK2 and the first clock signal ECLK1, and thus, the pull-up unit 400 is turned on. Since the pull-down unit 500 is turned off in the first period P1, the n$^{th}$ QB node QB(n) maintains the logic high voltage VH. Since a logic low voltage VL is applied to the n$^{th}$ Q node Q(n) in the first period P1, the fourth transistor T4 and the fifth transistor T5 are turned on and the n$^{th}$ QB' node QB'(n) and the n$^{th}$ QB node QB(n) are discharged by the high potential voltage VEH. The second transistor T2 remains turned-off in most time of the first period P1, and thus, by applying the high potential voltage VEH to the n$^{th}$ QB' node QB'(n) and the n$^{th}$ QB node QB(n) through the turned-on fourth and fifth transistors T4 and T5, it is possible to prevent the n$^{th}$ QB' node QB'(n) and the n$^{th}$ QB node QB(n) from floating for a long time, thereby stabilizing the emission driver.

In a 2-1 period P2-1 during a second period P2 where a signal of the n-1$^{th}$ QB' node QB(n-1), which is a QB' node in the previous stage EMD(n-1), periodically changes, the first transistor T1 is turned on by the second clock signal ECLK2 synchronized with the n$^{th}$ QB' node QB'(n-1) and pre-charges the n$^{th}$ Q' node Q'(n).

In the 2-2 period P2-2, if the second transistor T2 is turned on by the n$^{th}$ Q' node Q'(n) pre-charged with the logic low voltage VL, the first clock signal ECLK1 is transferred to the n$^{th}$ QB' node QB'(n). In this case, since the first clock signal ECLK1 is the logic low voltage VL and the second clock signal ECLK2 is the logic high voltage VH, the first transistor T1 is turned off. The voltage variation of the n$^{th}$ QB' node QB'(n) causes a voltage of the n$^{th}$ Q' node Q'(n) to decrease to a voltage lower than the logic low voltage VL due to the bootstrapping effect of the capacitor CQ'. In addition, since the third transistor T3 is turned on by the first clock signal ECLK which is the logic low voltage VL, the n$^{th}$ QB node QB(n) has the logic low voltage VL. In this case, a voltage lower than the logic low voltage VL is applied to the gate of the second transistor T2 due to the bootstrapping effect, and thus, the second transistor T2 is able to stably apply the first clock signal ECLK1 to the n$^{th}$ QB' node QB'(n).

In a 2-3 period P2-3, the second clock signal ECLK2 becomes the logic low voltage VL again, and the logic low voltage VL of the n-1$^{th}$ QB' node QB'(n-1) is applied to the n$^{th}$ Q' node Q'(n) via the first transistor T1 which is turned on by the second clock signal ECLK2. The logic high voltage VH of the first clock signal ECLK1 is applied to the n$^{th}$ QB' node QB'(n) via the second transistor T2 which is turned on by the n$^{th}$ Q' node Q'(n). In this case, the third transistor T3 is turned off by the first clock signal ECLK1, and thus, the n$^{th}$ QB node QB(n) maintains the voltage which is applied in the 2-2 period P2-2. In the 2-3 period P2-3, the voltage of the n$^{th}$ QB node QB(n) is the logic low voltage VL.

In a 2-4 period P2-4, the second clock signal ECLK2 has the logic high voltage VH and the first clock signal ECLK1 has the logic low voltage VL, and therefore, the first transistor T1 is turned off and the n$^{th}$ Q' node Q'(n) maintains the logic low voltage VL and the second transistor T2 is turned on. Since the first clock signal ECLK1 is applied to the n$^{th}$ QB' node QB'(n) via the second transistor T2 which is turned on, the n$^{th}$ Q' node Q'(n) has a voltage lower than the logic low voltage VL due to the bootstrapping effect of the capacitor CQ'. Thus, the second transistor T2 is able to be stably turned on and apply the intact logic low voltage to the n$^{th}$ QB' node QB'(n).

Since the n$^{th}$ Q node Q(n) maintains the logic high voltage VH in the second period P2, the fourth transistor T4 and the fifth transistor T5 remain turned-off.

Thus, the QB node adjuster 17-1 according to the first embodiment of this specification receives a signal from the n-1$^{th}$ QB' node QB'(n-1), shifts the signal as much as a cycle of an emission clock signal, and outputs the signal to the n$^{th}$ QB' node QB'(n). In addition, as the logic low voltage VL is applied to the n$^{th}$ QB node QB(n) by the third transistor T3 connected between the n$^{th}$ QB' node QB'(n) and the n$^{th}$ QB node QB(n), the pull-down unit 500 may be turned on and a n$^{th}$ emission signal EM(n) of a gate-off voltage may be output. Accordingly, it is possible to improve driving reliability of an emission driver including a QB node adjuster according to the first embodiment of this specification.

Figure 26:
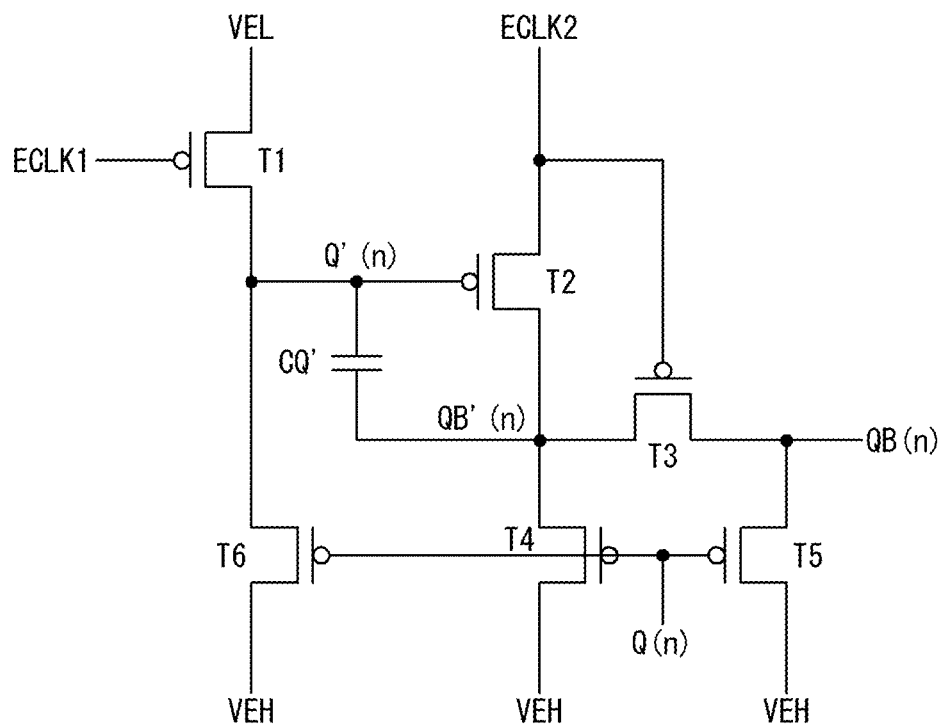
FIG. 26 is a circuit diagram of a QB node adjuster according to a second embodiment of this specification.

FIG. 26 is a circuit diagram of a QB node adjuster according to a second embodiment of this specification. FIG. 26 is a circuit diagram in which a sixth transistor T6 is added to the QB node adjuster 17-1 according to the first embodiment of this specification, and thus, in FIG. 26, the same components has the same effects and redundant description will be omitted or provided briefly.

A QB node adjuster 17-2 includes a Q'(n) node controller, a QB'(n) node controller, a QB(n) node controller, a QB(n)

holder, a QB'(n) holder, a Q'(n) holder, and a capacitor CQ'. Among them, the Q'(n) node controller, the QB'(n) node controller, and the QB(n) node controller may be in combination referred to as a QB(n) node charging unit.

The Q'(n) node controller is configured as a first transistor T1. The first transistor T1 includes a gate connected to a n-1$^{th}$ QB' node QB'(n-1), a source connected to an emission low voltage line to which a low potential voltage VEL is input, and a drain connected to a n$^{th}$ Q' node Q'(n). In a section where a voltage of the n-1$^{th}$ QB' node QB'(n-1) and a low potential voltage VEL are turn-on voltages, the first transistor T1 charges the n$^{th}$ Q' node Q'(n) to the low potential voltage VEL.

The QB'(n) node controller is configured as a second transistor T2. The second transistor T2 includes a gate connected to the n$^{th}$ Q' node Q'(n), a source connected to a first clock signal line to which a first clock signal ECLK1 is input, and a drain connected to the n$^{th}$ QB' node QB'(n). When a voltage of the n$^{th}$ Q' node Q'(n) is a turn-on voltage, the second transistor T2 applies the first clock signal ECLK1 to the n$^{th}$ QB' node QB'(n).

Both electrodes of the capacitor CQ' are respectively connected to the n$^{th}$ Q' node Q'(n) and the n$^{th}$ QB' node QB'(n). The capacitor CQ' bootstraps the n$^{th}$ Q' node Q'(n) according to change in a voltage of the n$^{th}$ QB' node QB'(n).

The QB(n) node controller is configured as a third transistor T3. The third transistor T3 includes a gate connected to the first clock signal line to which the first clock signal ECLK1 is input, a source connected to the n$^{th}$ QB' node QB'(n), and a drain connected to the n$^{th}$ QB node QB(n).

The QB(n) node holding unit is configured as a fifth transistor T5. The fifth transistor T5 includes a gate connected to the n$^{th}$ Q node Q(n), a source connected to the n$^{th}$ QB node QB(n), and a drain connected to an emission high voltage line to which a high potential voltage VEH is input. When a voltage of the n$^{th}$ Q node Q(n) is a turn-on voltage, the fifth transistor T5 discharges the n$^{th}$ QB node QB(n) to the high potential voltage VEH.

The QB'(n) node holding unit is configured as a fourth transistor T4. The fourth transistor includes a gate connected to the n$^{th}$ Q node Q(n), a source connected to the n$^{th}$ QB' node QB'(n), and a drain connected to the emission high voltage line to which the high potential voltage VEH is input. When a voltage of the n$^{th}$ Q node Q(n) is a turn-on voltage, the fourth transistor T4 discharges the n$^{th}$ QB' node QB'(n) to the high potential voltage VEH.

The Q'(n) node holding unit is configured as a sixth transistor T6. The sixth transistor T6 includes a gate connected to the n$^{th}$ Q node Q(n), a source connected to the n$^{th}$ Q' node Q'(n), a drain connected to the emission high voltage line to which the high potential voltage VEH is input. When a voltage of the n$^{th}$ Q node Q(n) is a turn-on voltage, the sixth transistor T6 discharges the n$^{th}$ Q' node Q'(n) to the high potential voltage VEH together with the fourth transistor T4 and the fifth transistor T5.

By applying the high potential voltage VEH to the n$^{th}$ Q' node Q'(n) through the sixth transistor T6, the QB node adjuster 17-2 according to the second embodiment of this specification may prevent the second transistor from being turned off for a reason that the n$^{th}$ Q' node Q'(n) falls to a logic low voltage due to the first transistor T1 remaining turned-off for a long time.

As a driving waveform diagram of the QB node adjuster 17-2 according to the second embodiment of this specification, a driving waveform diagram, as in FIG. 29, of a QB node adjuster according to an embodiment of this specification may be applied.

Figure 27:
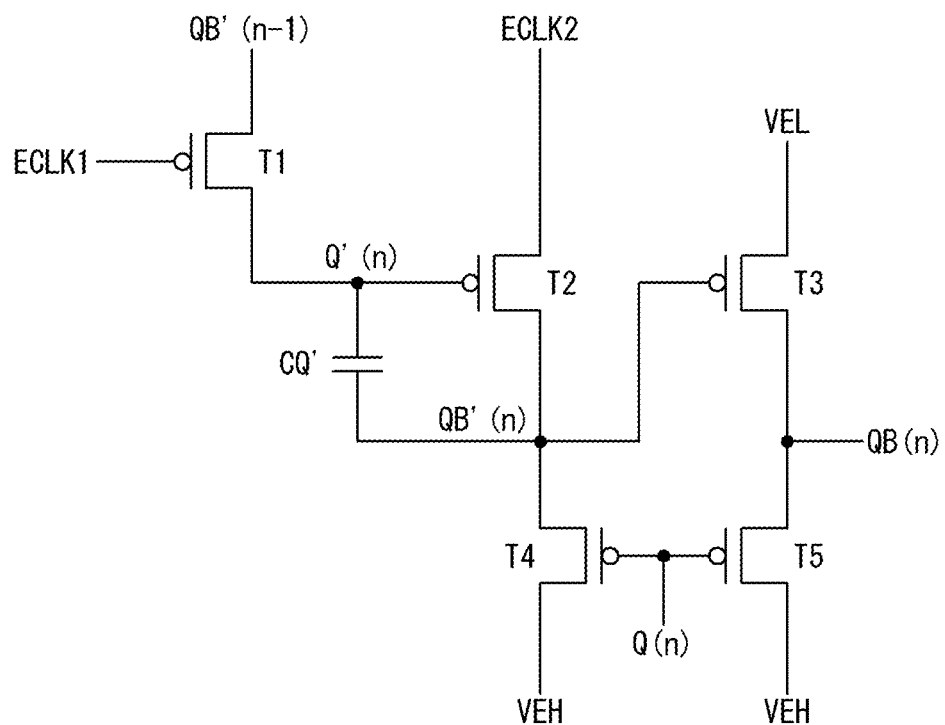
FIG. 27 is a circuit diagram of a QB node adjuster according to a third embodiment of this specification.

FIG. 27 is a circuit diagram of a QB node adjuster according to a third embodiment of this specification. FIG. 27 is a circuit diagram in which the connection structure of the third transistor T3 in the QB node adjuster 17-1 according to the first embodiment of this specification is changed. Thus, in FIG. 27, the same components has the same effects and redundant description will be omitted or provided briefly The QB node adjuster 17-3 includes a Q'(n) node controller, a QB'(n) node controller, a QB(n) node controller, a QB(n) holder, a QB'(n) holder, and a capacitor CQ'. Among them, the Q'(n) node controller, the QB'(n) node controller, and the QB(n) node controller may be in combination referred to as a QB(n) node charging unit.

The Q'(n) node controller is configured as a first transistor T1. The first transistor T1 includes a gate connected to a second clock signal line to which a second clock signal ECLK2 is input, a source connected to a n-1$^{th}$ QB' node QB'(n-1), and a drain connected to a n$^{th}$ Q' node Q'(n). In a section where the second clock signal ECLK2 and the n-1$^{th}$ QB' node QB'(n-1) have a turn-on voltage, the first transistor T1 charges the n$^{th}$ Q' node Q'(n) to a low potential voltage VEL.

The QB'(n) node controller is configured as a second transistor T2. The second transistor T2 includes a gate connected to the n$^{th}$ Q' node Q'(n), a source connected to a first clock signal line to which a first clock signal ECLK1 is input, and a drain connected to a n$^{th}$ QB' node QB'(n). When a voltage of the n$^{th}$ Q' node Q'(n) is a turn-on voltage, the second transistor T2 applies the first clock signal ECLK1 to the n$^{th}$ QB' node QB'(n).

Both electrodes of the capacitor CQ' are respectively connected to the n$^{th}$ Q' node Q'(n) and the n$^{th}$ QB' node QB'(n). The capacitor CQ' bootstraps the n$^{th}$ Q' node Q'(n) according to change in a voltage of the n$^{th}$ QB' node QB'(n).

The QB(n) node controller is configured as a third transistor T3. The third transistor T3 includes a gate connected to the n$^{th}$ QB' node QB'(n), a source connected to an emission low voltage line to which a low potential voltage VEL is input, and a drain connected to the n$^{th}$ QB node QB(n). When a voltage of the n$^{th}$ QB' node QB'(n) is a logic low voltage VL, the third transistor T3 is turned on and applies the low potential voltage VEL to the n$^{th}$ QB node QB(n). In addition, when the n$^{th}$ QB' node QB'(n) has a logic high voltage VH, the third transistor T3 is turned off so that the n$^{th}$ QB node QB(n) is able to maintain the previously applied voltage.

The QB(n) node holding unit is configured as a fifth transistor T5. The fifth transistor T5 includes a gate connected to the n$^{th}$ Q node Q(n), a source connected to the n$^{th}$ QB node QB(n), and a drain connected to an emission high voltage line to which a high potential voltage VEH is input. When a voltage of the n$^{th}$ Q node Q(n) is a turn-on voltage, the fifth transistor T5 discharges the n$^{th}$ QB node QB(n) to the high potential voltage VEH.

The QB'(n) node holding unit is configured as a fourth transistor T4. The fourth transistor T4 includes a gate connected to the n$^{th}$ Q node Q(n), a source connected to the n$^{th}$ QB' node QB'(n), and a drain connected to the emission high voltage line to which the high potential voltage VEH is input. When a voltage of the n$^{th}$ Q node Q(n) is a turn-on voltage, the fourth transistor T4 discharges the n$^{th}$ QB' node QB'(n) to the high potential voltage VEH.

The QB node adjuster 17-3 according to the third embodiment of this specification implements a shift circuit, which receives an input of a signal from a previous-stage QB' node, in a bootstrapping manner, thereby enabled to reduce influence of increased load of an emission clock signal and stably perform outputting of a QB node.

As a driving waveform diagram of the QB node adjuster 17-3 according to the third embodiment of this specification, the driving waveform diagram shown in FIG. 29 of a QB node adjuster according to an embodiment may be applied.

Figure 28:
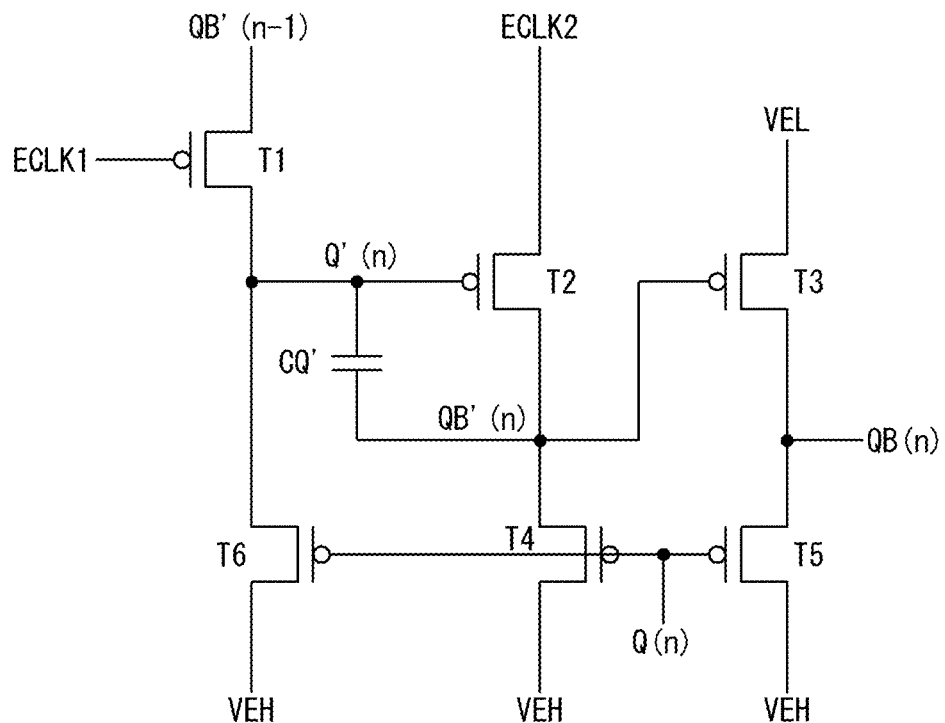
FIG. 28 is a circuit diagram of a QB node adjuster according to a fourth embodiment of this specification.

FIG. 28 is a circuit diagram of a QB node adjuster according to a fourth embodiment of this specification. FIG. 28 is a circuit diagram in which the connection structure of the third transistor T3 in the QB node adjuster 17-1 according to the first embodiment of this specification is changed and a sixth transistor T6 is added. Thus, in FIG. 27, the same components has the same effects and redundant description will be omitted or provided briefly The QB node adjuster 17-4 includes a Q'(n) node controller, a QB'(n) node controller, a QB(n) node controller, a QB(n) holder, a QB'(n) holder, a Q'(n) holder, and a capacitor CQ'. Among them, the Q'(n) node controller, the QB'(n) node controller, and the QB(n) node controller may be in combination referred to as a QB(n) node charging unit.

The Q'(n) node controller is configured as a first transistor T1. The first transistor T1 include a gate connected to a second clock signal line to which a second clock signal ECLK2 is input, a source connected to a n-1$^{th}$ QB' node QB'(n-1), and a drain connected to a n$^{th}$ Q' node Q'(n). In a section where the second clock signal ECLK2 and the n-1$^{th}$ QB' node QB'(n-1) have turn-on voltages, the first transistor T1 charges the nth Q' node Q'(n) to a low potential voltage VEL.

The QB'(n) node controller is configured as a second transistor T2. The second transistor T2 includes a gate connected to the n$^{th}$ Q' node Q'(n), a source connected to a first clock signal line to which a first clock signal ECLK1 is input, and a drain connected to the n$^{th}$ QB' node QB'(n). When a voltage of the n$^{th}$ Q' node Q'(n) is a turn-on voltage, the second transistor T2 applies the first clock signal ECLK1 to the n$^{th}$ QB' node QB'(n).

Both electrodes of the capacitor CQ' are respectively connected to the n$^{th}$ Q' node Q'(n) and the n$^{th}$ QB' node QB'(n). The capacitor CQ' bootstraps the n$^{th}$ Q' node Q'(n) according to change in a voltage of the n$^{th}$ QB' node QB'(n).

The QB(n) node controller is configured as a third transistor T3. The third transistor T3 includes a gate connected to the n$^{th}$ QB' node QB'(n), a source connected to an emission low voltage line to which a low potential voltage VEL is input, and a drain connected to the n$^{th}$ QB node QB(n). When a voltage of the QB' node QB'(n) is a logic low voltage, the third transistor T3 is turned on and applies the low potential voltage VEL to the n$^{th}$ QB node QB(n). In addition, when a voltage of the n$^{th}$ QB' node QB'(n) is a logic high voltage VH, the third transistor T3 is turned off so that the n$^{th}$ QB node QB(n) is able to maintain a previously-applied voltage.

The QB(n) node holding unit is configured as a fifth transistor T5. The fifth transistor T5 includes a gate connected to the n$^{th}$ Q node Q(n), a source connected to the n$^{th}$ QB node QB(n), and a drain connected to an emission high voltage line to which a high potential voltage is input. When a voltage of the n$^{th}$ Q node Q(n) is a turn-on voltage, the fifth transistor T5 discharges the n$^{th}$ QB node QB(n) to the high potential voltage VEH.

The QB'(n) node holding unit is configured as a fourth transistor T4. The fourth transistor T4 includes a gate connected to the n$^{th}$ Q node Q(n), a source connected to the n$^{th}$ QB' node QB'(n), and a drain connected to the emission high voltage line to which the high potential voltage VEH is input. When a voltage of the n$^{th}$ Q node Q(n) is a turn-on voltage, the fourth transistor T4 discharges the n$^{th}$ QB' node QB'(n) to the high potential voltage.

The Q'(n) node holding unit is configured as a sixth transistor T6. The sixth transistor T6 includes a gate connected to the n$^{th}$ Q node Q(n), a source connected to the n$^{th}$ Q' node Q'(n), and a drain connected to the emission high voltage line to which the high potential voltage VEH is input. When a voltage of the n$^{th}$ Q node Q(n) is a turn-on voltage, the sixth transistor T6 discharges the n$^{th}$ Q' node Q'(n) to the high potential voltage together with the fourth transistor T4 and the fifth transistor T5. Thus, by applying the high potential voltage VEH to the n$^{th}$ Q' node Q'(n) through the sixth transistor T6, it is possible to prevent the second transistor from being turned off because the n$^{th}$ Q' node Q'(n) drops to a logic low voltage due to the first transistor T1 remaining turned-off for a long time.

The QB node adjuster 17-4 according to the fourth embodiment of this specification implements a shift circuit, which receives an input of a signal from a previous-stage QB' node, in a bootstrapping manner, thereby enabled to reduce influence of increased load of an emission clock signal and stably perform outputting of a QB node.

As a driving waveform diagram of the QB node adjuster 17-4 according to the fourth embodiment of this specification, the same driving waveform diagram as in FIG. 29 of a QB node adjuster according to an embodiment may be applied.

Embodiments of this specification may be described as below.

An electroluminescent display according to this specification includes pixels connected to gate lines, and a gate driving circuit configured to supply a gate signal to at least one of the gate lines and composed of a plurality of stages connected to each other in a cascading way. A n$^{th}$ (n is a positive integer) stage of the gate driving circuit includes a Q1 node charging unit to charge a Q1 node to a turn-on voltage using first and second clock signals in reverse-phase, and a pull-up transistor to apply the turn-on voltage to an output terminal in response to a Q1 node voltage. The Q1 node charging unit includes a first charging unit to charge the Q1 node voltage to the turn-on voltage, and a second charging unit to charge a Q2 node, which is coupled to the Q1 node, using the first clock signal in a section where the Q1 node has the turn-on voltage.

The first charging unit may be connected between a start signal input terminal and the Q1 node. The first charging unit may include a first transistor having a gate electrode connected to a second clock signal input terminal.

The second charging unit may be connected between a first clock signal input terminal and the Q2 node. The second charging unit may include a first capacitor having a gate electrode connected to the Q1 node, and a first capacitor connected between the Q1 node and the Q2 node.

The Q1 node charging unit may further include a Q2 node controller to apply an electric potential voltage to the Q2 node in a section where the Q1 node has a turn-off voltage.

The Q2 node controller may include a gate electrode connected to the second clock signal input terminal, a drain electrode connected to the Q2 node, and a source electrode connected to a high potential voltage input terminal.

The gate driving circuit may further include a pull-down unit to control the output terminal to output a turn-off voltage in response to a voltage of a QB1 node, and a node controller to control a voltage of the QB1 node to a level opposite to a level of the voltage of the Q1 node.

The node controller may further include a second capacitor connected between the QP node and the QB1 node, and a QP node controller connected to a QB2 node of a n-1$^{th}$ stage and QP node.

The node controller may further include a QB2 node controller to apply a turn-on voltage of the first clock signal to the QB2 node in response to a voltage of the QP node.

The node controller may further include a QB1 node controller having a gate electrode connected to the first clock signal input terminal, from which the first clock signal is applied, the QB1 node controller which is to apply a voltage of the QB2 node to the QB1 node.

The gate driving circuit according to this specification is composed of a plurality of stages connected to each other in a cascading way, and outputs gate signals. Each of the plurality of stages outputs a gate signals using the first and second clock signals. Among the plurality of stages, a n$^{th}$ (n is a positive integer) stage includes a pull-up transistor to apply a turn-on voltage to an output terminal in response to a Q1 node voltage, a first capacitor connected between the Q1 node and a Q2 node, a first transistor which includes a gate electrode connected to a second clock signal input terminal, a source electrode connected to a start signal input terminal, and a drain electrode connected to the Q1 node, and a second transistor which includes a gate electrode connected to the Q1 node, a source electrode connected to a first clock signal input terminal, and a drain electrode connected to the Q2 node.

The first clock signal and the second clock signal may be in reverse-phase.

One cycle of each of the first clock signal and the second clock signal may be two horizontal periods.

A start signal may be a gate signal output from a n-1$^{th}$ stage.

The n$^{th}$ stage may further include a transistor which includes a drain electrode connected to the Q2 node, a source electrode connected to a high potential voltage input terminal, and a gate electrode connected to a second clock signal input terminal.

The gate driving circuit according to an embodiment of the present disclosure includes a first output buffer to be turned on based on an electric potential of the Q node to thereby output the first emission signal, and a second output buffer configured as a double buffer. The double buffer includes two transistors, and the two transistors include gate electrodes connected to different nodes and output the same second emission signal.

According to another feature of the present disclosure, the n$^{th}$ stage may further include a QB2 node controller to control a QB2 node based on the electric potential of the Q node, and a QB1 node controller to control the QB1 node based on the electric potential of the QB2 node. The QB1 node and the QB2 node may have different electric potentials.

According to another feature of the present disclosure, the second output buffer may include a 2-1 output buffer composed of a transistor to operate in response to the electric potential of the QB1 node, and a 2-2 output buffer composed of a transistor to operate in response to the electric potential of the QB2 node.

The gate driving circuit according to an embodiment of the present disclosure may include a Q node controller to control the Q node based on a start signal transferred through a start signal line, a QB2 node controller to control the QB2 node based on the electric potential of the Q node, a QB1 node controller to control the QB1 node based the electric potential of the QB2 node, a first output buffer to be turned on based on the electric potential of the Q node to thereby output a first emission signal, and a second output buffer having at least two transistors which are turned on based on electric potentials of different nodes to thereby output a second emission signal.

According to another feature of the present disclosure, the first output buffer may output a logic-low emission signal, and the second output buffer may output a logic-high emission signal which has a voltage higher than a voltage of a logic-low emission signal.

According to another feature of the present disclosure, the second output buffer may have a parallel-connected structure in which first electrodes of at least two transistors are connected only to each other, second electrodes thereof are connected only to each other, and gate electrodes thereof are connected to different nodes.

According to another feature of the present disclosure, the second output buffer may include a 2-1 output buffer composed of a transistor to operate based on a first electric potential, and a 2-2 output buffer composed of a transistor to operate a second electric potential different from the first electric potential.

According to another feature of the present disclosure, the first electric potential may be an electric potential of the QB1 node, and the second electric potential may be an electric potential of the QB2 node.

An electroluminescent display according to an embodiment of the present disclosure includes a display panel configured to display an image, and a gate driving circuit including scan drivers, which output scan signals to the display panel, and emission drivers, which output emission signals to the display panel. Among the emission drivers, a n$^{th}$ (n is a positive integer) emission driver includes a first output buffer to be turned on based on an electric potential of a Q node to thereby output a first emission signal, and a second output buffer composed of double buffers. The double buffer includes two transistors, and the two transistors include gate electrodes connected to different nodes and output the same second emission signal.

According to another feature of the present disclosure, the second output buffer may have a parallel-connected structure in which first electrodes of at least two transistors are connected only to each other, second electrodes thereof connected only to each other, and gate electrodes thereof are connected to different nodes.

According to another feature of the present disclosure, the second output buffer may include a 2-1 output buffer composed of a transistor to operate based on a first electric potential, and a 2-2 output buffer composed of a transistor to operate based on a second electric potential different from the first electric potential.

According to another feature of the present disclosure, the n$^{th}$ emission driver may further include a QB2 node controller to control a QB2 node based on an electric potential of a Q node, and a QB1 node controller to control a QB1 node based on an electric potential of the QB2 node. The QB1 node and the QB2 node may have different electric potentials.

According to another feature of the present disclosure, the second output buffer may include a 2-1 output buffer composed of a transistor to operate based on an electric potential of the QB1 node, and a 2-2 output buffer composed of a transistor to operate based on an electric potential of the QB2 node.

According to another feature of the present disclosure, the n$^{th}$ emission driver may include a first transistor which includes a gate electrode connected to a second clock signal line, a first electrode connected to a start signal line, and a second electrode connected to a Q node, a second transistor which includes a gate electrode connected to the Q node, and a first electrode connected to a first clock signal line, a third transistor which includes a gate electrode connected to a QB2 node, a first electrode connected to the Q node, and a second electrode connected to a high potential voltage input terminal, a fourth transistor which includes a gate electrode connected to the second clock signal line, a first electrode connected to a n-$1^{th}$ QB2 node of a n-$1^{th}$ emission driver, and a second electrode connected to a QP node, a fifth transistor which includes a gate electrode connected to the Q node, a first electrode connected to the QB2 node, and a second electrode connected to the high potential voltage input terminal, a sixth transistor which includes a gate electrode connected to the Q node, a first electrode connected to a low potential voltage input terminal, and a second electrode connected to an output terminal of the $n^{th}$ emission driver, a 7-1 transistor which includes a gate electrode connected to a QB1 node, a first electrode connected to the output terminal of the $n^{th}$ emission driver, and a second electrode connected to the high potential voltage input terminal, a 7-2 transistor which includes a gate electrode connected to the QB2 node, a first electrode connected to the output terminal of the $n^{th}$ emission driver, and a second electrode connected to the high potential voltage input terminal, an eighth transistor which includes a gate electrode connected to the QP node, a first electrode connected to the first clock signal line, and a second electrode connected to the QB2 node, a ninth transistor which includes a gate electrode connected to the first clock signal line, a first electrode connected to the QB2 node, and a second electrode connected to the QB1 node, and a tenth transistor which includes a gate electrode connected to the Q node, a first electrode connected to the QB1 node, and a second electrode connected to the high potential voltage input terminal.

According to another feature of the present disclosure, the $n^{th}$ emission driver may further include a first capacitor which includes one end connected to the second electrode of the second transistor, and the other end connected to the Q node and the first electrode of the third transistor, a second capacitor which includes one end connected to the QP node, and the other end connected to the other end connected to the QB2 node, and a third capacitor which includes one end connected to the QB1 node, and the other end connected to the high potential voltage input terminal.

According to another feature of the present disclosure, the first transistor, the second transistor, the third transistor, and the first capacitor may be included in a Q node controller for controlling the Q node, the fifth transistor, the tenth transistor, and the third capacitor may be included in a QB1 node controller for controlling the QB1 node, the fourth transistor, the eighth transistor, and the second capacitor may be included in a QB2 node controller for controlling the QB2 node, the sixth transistor may be included in a first output buffer for outputting a first emission signal, and the 7-1 transistor and the 7-2 transistor may be included in a second output buffer for outputting a second emission signal.

An electroluminescent display according to an embodiment of the present disclosure may include a display panel, and a gate driving circuit which includes scan drivers for outputting scan signals to the display panel and emission drivers for outputting emission signals to the display panel. Among the emission drivers, a $n^{th}$ (n is a positive integer) emission driver includes a Q node controller to control a Q node based on a start signal transferred through a start signal line, a QB2 node controller to control a QB2 node based on an electric potential of the Q node, a QB1 node controller to control a QB1 node based on an electric potential of the QB2 node, a first output buffer to be turned on based on the electric potential of the Q node to thereby output a first emission signal, and a second output buffer having at least two transistors which are turned on based on electric potentials of different nodes to thereby output a second emission signals.

According to another feature of the present disclosure, the at least two transistors of the second output buffer of the present disclosure may have a parallel-connected structure in which first electrodes of the at least two transistors are connected only to each other, second electrodes thereof are connected only to each other, and gate electrodes thereof are connected to different nodes.

According to another feature of the present disclosure, the second output buffer may include a 2-1 output buffer composed of a transistor to operate in response to an electric potential of the QB1 node, and a 2-2 output buffer composed of a transistor to operate based on an electric potential of the QB2 node.

According to another feature of the present disclosure, the $n^{th}$ emission driver may include a first transistor which includes a gate electrode connected to a second clock signal line, a first electrode connected to a start signal line, and a second electrode connected to a Q node, a second transistor which includes a gate electrode connected to the Q node, and a first electrode connected to a first clock signal line, a third transistor which includes a gate electrode connected to a QB2 node, a first electrode connected to the Q node, and a second electrode connected to a high potential voltage input terminal, a fourth transistor which includes a gate electrode connected to the second clock signal line, a first electrode connected to a n-$1^{th}$ QB2 node of a n-$1^{th}$ emission driver, and a second electrode connected to a QP node; a fifth transistor which includes a gate electrode connected to the Q node, a first electrode connected to the QB2 node, and a second electrode connected to the high potential voltage input terminal, a sixth transistor which includes a gate electrode connected to the Q node, a first electrode connected to a low potential voltage input terminal, and a second electrode connected to an output terminal of the $n^{th}$ emission driver, a 7-1 transistor which includes a gate electrode connected to a QB1 node, a first electrode connected to the output terminal of the $n^{th}$ emission driver, and a second electrode connected to the high potential voltage input terminal, a 7-2 transistor which includes a gate electrode connected to the QB2 node, a first electrode connected to the output terminal of the $n^{th}$ emission driver, and a second electrode connected to the high potential voltage input terminal, an eighth transistor which includes a gate electrode connected to the QP node, a first electrode connected to the first clock signal line, and a second electrode connected to the QB2 node, a ninth transistor which includes a gate electrode connected to the first clock signal line, a first electrode connected to the QB2 node, and a second electrode connected to the QB1 node, and a tenth transistor which includes a gate electrode connected to the Q node, a first electrode connected to the QB1 node, and a second electrode connected to the high potential voltage input terminal.

An electroluminescent display according to an embodiment of the present disclosure includes pixels connected to emission lines, and an emission driver to supply emission signals to the emission lines and composed of a plurality of stages. Among the plurality of stages, a $n^{th}$ (n is a positive integer equal to or greater than 2) stage includes a pull-up unit controlled by a Q node to output an emission signal having a turn-on voltage, a pull-down unit controlled by the Q node or a QB node to output a turn-off voltage, a QB node controller interposed between the QB node and a QB' node, and a QB node adjuster to shift a voltage of the QB' node of a n-1$^{th}$ stage and applies the shifted voltage to the QB' node. Accordingly, it is possible to reduce influence of increased load of an emission clock signal and stably perform outputting of the QB node, thereby improving reliability of the emission driver.

The n$^{th}$ stage of the electroluminescent display may further include a Q node controller to control a voltage of the Q node using emission signals from the n-1$^{th}$ stage.

Each of the pixels may include a light emitting device and a pixel driving circuit, and each of the emission lines may be connected to an emission transistor included in a pixel driving circuit.

The QB node controller may include a Q' node controller, a QB' node controller, a QB node holding unit, the QB' node holding unit, and a capacitor.

The Q' node controller may be controlled by a first emission clock signal to apply a voltage of a QB' node of a n-1$^{th}$ stage to a Q' node. The QB' node controller may be controlled by the Q' node to apply a second emission clock signal to the QB' node. The QB' node holding unit may be controlled by the Q node to discharge the QB node to an emission high voltage. The QB' node holding unit may be controlled by the Q node to discharge the QB' node to the emission high voltage. The capacitor may be connected between the Q' node and the QB' node. The QB node controller may control short between the QB' node and the QB node in accordance with a second emission clock signal or may be controlled by the QB' node to apply the emission low voltage to the QB node.

The first emission clock signal and the second emission clock signal may be in reverse-phase.

The QB node adjuster may further include a Q' node holding unit.

The Q' node controller may be controlled by the first emission clock signal to apply a voltage of the QB' node of the n-1$^{th}$ stage to the Q' node. The QB' node controller may be controlled by the Q' node to apply the second emission clock signal to the QB' node. The QB node holding unit may be controlled by the Q node to discharge the QB node to the emission high voltage. The QB' node holding unit may be controlled by the Q node to discharge the QB' node to the emission high voltage. The Q' node holding unit may be controlled by the Q node to discharge the Q' node to the emission high voltage. The capacitor may be connected between the Q' node and the QB' node. The QB node controller may control short of the QB' node and the QB node based on the second emission clock signal or may be controlled by the QB' node to apply an emission low voltage to the QB node.

According to an embodiment of this specification, when it comes to a gate driving circuit including n number (n is a positive integer equal to or greater than 2) of stages, a k$^{th}$ (1≤k≤n) stage includes a pull-up unit, a pull-down unit, a Q node controller to control a Q node connected to the pull-up unit, and a QB node adjuster to control a QB node connected to the pull-down unit. The QB node adjuster includes a Q' node controller, a QB' node controller, a QB node controller, a QB' node holding unit, and a QB node holding unit. The QB node adjuster shifts a level of a voltage of the QB' node of the k-1$^{th}$ stage and applies the level-shifted voltage to a voltage of the QB' node. Accordingly, it is possible to reduce influence of increased load of an emission clock signal and allows a QB node to perform outputting stably, thereby improving reliability of the emission driver.

The QB node adjuster may be applied with an emission low voltage, an emission high voltage, a first emission clock signal, and a second emission clock signal. The emission low voltage is a voltage lower than the emission high voltage. The first emission clock signal and the second emission clock signal may swing between the emission low voltage and the emission high voltage.

The QB node adjuster may further include a capacitor. The Q' node controller may include a first transistor. The QB' node controller may include a second transistor. The QB node controller may include a third transistor. The QB' node holding unit may include a fourth transistor. The QB node holding unit may include a fifth transistor. The capacitor may be connected to the Q' node and the QB' node.

The first transistor may include a gate connected to a second clock signal line, a first electrode connected to a QB' node of a k-1$^{th}$ stage, and a second electrode connected to the Q' node. The second transistor may include a gate connected to the Q' node, a first electrode connected to a first clock signal line, and a second electrode connected to the QB' node. The third transistor may include a gate connected to the first clock signal line, a first electrode connected to the QB' node, and a second electrode connected to the QB node. The fourth transistor may include a gate connected to the Q node, a first electrode connected to the QB' node, and a second electrode connected to an emission high voltage line. The fifth transistor may include a gate connected to the Q node, a first electrode connected to the QB node, and a second electrode connected to the emission high voltage line.

The QB node adjuster may further include a Q' node holding unit, and the Q' node holding unit may be configured as a sixth transistor. The sixth transistor may include a gate connected to the Q node, a first electrode connected to the Q' node, and a second electrode connected to the emission high voltage line.

The first transistor may include a gate connected to a second clock signal line, a first electrode connected to a QB' node of a k-1$^{th}$ stage, and a second electrode connected to the Q' node. The second transistor may include a gate connected to the Q' node, a first electrode connected to a first clock signal line, and a second electrode connected to the QB' node. The third transistor may include a gate connected to the QB' node, a first electrode connected to an emission low voltage line, and a second electrode connected to the QB node. The fourth transistor may include a gate connected to the Q node, a first electrode connected to the QB' node, and a second electrode connected to an emission high voltage line. The fifth transistor may include a gate connected to the Q node, a first electrode connected to the QB node, and a second electrode connected to the emission high voltage line.

The QB node adjuster may further include a Q' node holding unit, and the Q' node holding unit may be configured as a sixth transistor. The sixth transistor may include a gate connected to the Q node, a first electrode connected to the Q' node, and a second electrode connected to the emission high voltage line.

The embodiments of this specification stably maintains a voltage of a node controlling a pull-up transistor of a gate driving circuit, thereby improving driving capability and reliability of the gate driving circuit and allowing an electroluminescent display to display an image accurately.

In addition, the embodiments of this specification provide a gate driving circuit capable of improving driving capability of a transistor and maintaining stable outputting characteristics, and therefore, a narrow bezel of an electroluminescent display including the gate driving circuit may be achieved.

In addition, the embodiments of this specification implements a gate driving circuit including an output buffer implemented as double buffers, and thus, even when a threshold voltage of a transistor operating as an output buffer shifts, the shift may be compensated, so stable outputting characteristics may be maintained, thereby improving driving reliability of the gate driving circuit.

In addition, the embodiments of this specification include an emission driver based on a shift register, thereby resolving signal delay caused by loads in a clock signal line.

In addition, the embodiments of this specification does not invert a Q node to a structure for controlling a QB node included in the emission driver and then apply a voltage to the QB node instead, a QB node adjuster is additionally provided to control the QB node, thereby reducing influence of increased load of an emission clock signal.

In addition, according to the embodiments of this specification, the QB node adjuster implements a shift circuit, which receives an input of a signal from a QB' node of a previous stage, in a bootstrapping manner, thereby enabled to reduce influence of increased load of an emission clock signal and stably perform outputting of a QB node.

In addition, according to the embodiments of this specification, the QB node adjuster may include a QB' node and transistors connected to the QB node, and apply an emission high voltage to the QB' node and the QB node to prevent the QB' node and the QB node from floating for a long time, thereby stabilizing an emission driver.

In addition, according to the embodiments of this specification, the QB node adjuster may include a transistor applying an emission high voltage to a Q' node, so that a transistor having a gate connected to the Q' node is prevented from being turned on for a reason that the Q' node falls to a logic low voltage due to a transistor remaining turned-off for a long time.

It will be apparent to those skilled in the art that various modifications and variations can be made in the gate driving circuit and the electroluminescent display using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display comprising:
pixels connected to gate lines; and
a gate driving circuit to supply a gate signal to at least one of the gate lines, and composed of a plurality of stages connected to each other in a cascading way,
wherein an nth (n is a positive integer) stage of the gate driving circuit comprises:
a Q1 node charging unit to charge a Q1 node to a turn-on voltage using a first and a second clock signal,
a pull-up transistor to apply a turn-on voltage to an output terminal in response to a voltage of the Q1 node,
a pull-down unit to control the output terminal to output a turn-off voltage in response to a voltage of a QB1 node; and
a node controller to control the voltage of the QB1 node to a level opposite to a level of the voltage of the Q1 node,
wherein the Q1 node charging unit comprises:
a first charging unit to charge the voltage of the Q1 node to a turn-on voltage using the second clock signal, and
a second charging unit to charge a Q2 node, coupled to the Q1 node, using the first clock signal in a section where the Q1 node has a turn-on voltage,
wherein the node controller comprises:
a QB2 node controller to apply a turn-on voltage of the first clock signal to a QB2 node in response to a voltage of a QP node, and
wherein the QB2 node controller further comprises:
a second capacitor connected between the QP node and the QB2 node; and
a QP node controller connected between a QB2 node of a (n-1)th stage and the QP node.

2. The electroluminescent display of claim 1,
wherein the first charging unit comprises a first transistor connected between a start signal input terminal and the Q1 node and having a gate electrode connected to an input terminal of the second clock signal,
wherein the second charging unit comprises a second transistor connected between an input terminal of the first clock signal and the Q2 node and having a gate electrode connected to the Q1 node, and a first capacitor connected between the Q1 node and the Q2 node.

3. The electroluminescent display of claim 1, wherein the node controller further comprises a QB1 node controller connected to an input terminal of the first clock signal, from which a gate electrode is applied with the first clock signal, and to apply a voltage of the QB2 node to the QB1 node.

4. The electroluminescent display of claim 1, wherein the first and second clock signals are in reverse-phase.

5. The electroluminescent display of claim 1, wherein one cycle of each of the first and the second clock signals is two horizontal periods.

6. An electroluminescent display comprising:
pixels connected to gate lines; and
a gate driving circuit to supply a gate signal to at least one of the gate lines, and composed of a plurality of stages connected to each other in a cascading way,
wherein an nth (n is a positive integer) stage of the gate driving circuit comprises:
a Q1 node charging unit to charge a Q1 node to a turn-on voltage using a first and a second clock signal,
a pull-up transistor to apply a turn-on voltage to an output terminal in response to a voltage of the Q1 node,
a pull-down unit to control the output terminal to output a turn-off voltage in response to a voltage of a QB1 node; and
a node controller to control the voltage of the QB1 node to a level opposite to a level of the voltage of the Q1 node,
wherein the pull-down unit is configured as double buffers,
wherein the double buffers comprises two transistors, and the two transistors comprise gate electrodes connected to different nodes and output the turn-off voltage.

7. The electroluminescent display of claim 6, wherein the pull-down unit comprises:
a first pull-down transistor operates in response to an electric potential of the QB1 node; and a second pull-down transistor operates in response to the electric potential of a QB2 node.

\* \* \* \* \*